US012622288B2

(12) United States Patent
Xu et al.

(10) Patent No.: US 12,622,288 B2
(45) Date of Patent: May 5, 2026

(54) PACKAGE SUBSTRATE AND/OR A BOARD WITH A SHARED POWER DISTRIBUTION NETWORK

(71) Applicant: QUALCOMM Incorporated, San Diego, CA (US)

(72) Inventors: Lili Xu, San Diego, CA (US); Jason Gonzalez, Solana Beach, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 800 days.

(21) Appl. No.: 17/988,642

(22) Filed: Nov. 16, 2022

(65) Prior Publication Data

US 2024/0162155 A1 May 16, 2024

(51) Int. Cl.
| | |
|---|---|
| *H01L 23/538* | (2006.01) |
| *H01L 23/64* | (2006.01) |
| *H01L 25/16* | (2023.01) |
| *H01L 49/02* | (2006.01) |
| *H10D 1/68* | (2025.01) |
| *H10W 44/00* | (2026.01) |
| *H10W 70/60* | (2026.01) |
| *H10W 70/685* | (2026.01) |
| *H10W 90/00* | (2026.01) |

(52) U.S. Cl.
CPC ............ *H10W 70/611* (2026.01); *H10D 1/68* (2025.01); *H10W 44/501* (2026.01); *H10W 70/685* (2026.01); *H10W 90/00* (2026.01); *H10W 90/724* (2026.01)

(58) Field of Classification Search
CPC ... H01L 23/5383; H01L 23/645; H01L 25/16; H01L 24/16; H01L 2224/16227; H10D 1/68
See application file for complete search history.

(56) References Cited

U.S. PATENT DOCUMENTS

| | | | |
|---|---|---|---|
| 7,015,575 B2 * | 3/2006 | Suenaga | .................. H01L 23/50 257/E23.079 |
| 2006/0050491 A1 * | 3/2006 | Hayashi | ............... H05K 1/0231 361/760 |

(Continued)

OTHER PUBLICATIONS

International Search Report and Written Opinion—PCT/US2023/077177—ISA/EPO—Feb. 6, 2024.

*Primary Examiner* — Peniel M Gumedzoe
(74) *Attorney, Agent, or Firm* — Loza & Loza, LLP

(57) ABSTRACT
A device comprising a substrate, a first integrated device coupled to a first surface of the substrate, a second integrated device coupled to the first surface of the substrate, a first passive device coupled to a second surface of the substrate and a second passive device coupled to the second surface of the substrate. The substrate comprises at least one dielectric layer and a plurality of interconnects. The plurality of interconnects include a power interconnect. The power interconnect is configured to be electrically coupled to power. The first integrated device, the first passive device, the second integrated device and the second passive device are configured to be electrically coupled to the power interconnect through a first plurality of interconnects from the plurality of interconnects. The first plurality of interconnects are configured to operate as an inductor, where the first plurality of interconnects include a via interconnect.

30 Claims, 25 Drawing Sheets

*CROSS SECTIONAL PROFILE VIEW*

(56) References Cited

U.S. PATENT DOCUMENTS

| | | |
|---|---|---|
| 2011/0050334 A1 | 3/2011 | Pan et al. |
| 2014/0268615 A1 | 9/2014 | Yun et al. |
| 2019/0164681 A1 | 5/2019 | Kidwell, Jr. et al. |
| 2020/0168538 A1* | 5/2020 | Ong .................... H01L 23/5385 |
| 2021/0296278 A1* | 9/2021 | Yen ......................... H01L 25/10 |
| 2021/0343684 A1* | 11/2021 | Kim ....................... H10D 1/692 |
| 2022/0336381 A1* | 10/2022 | Nishiyama ........ H01L 23/49838 |

* cited by examiner

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

1000

107

BOARD
SUBSTRATE OR
PACKAGE
SUBSTRATE

1010

107

BOARD
SUBSTRATE

PACKAGE
SUBSTRATE

CROSS SECTIONAL PROFILE VIEW

INTERCONNECT FORMATION

DIELECTRIC LAYER FORMATION

CAVITY FORMATION

*FIG. 14B*

INTERCONNECT
FORMATION

SOLDER RESIST
LAYER
FORMATION

SUBSTRATE

DEVICE(S) AND/OR COMPONENT(S) COUPLING / MOUNTING

ENCAPSULATION FORMATION

DEVICE(S) AND/OR COMPONENT(S) COUPLING / MOUNTING

SOLDER INTERCONNECT COUPLING

1600

PROVIDE A SUBSTRATE COMPRISING INTERCONNECTS — 1605

COUPLE INTEGRATED DEVICE(S) AND/OR COMPONENT(S) TO A FIRST SURFACE OF THE SUBSTRATE — 1610

FORM ENCAPSULATION LAYER OVER THE SUBSTRATE AND THE INTEGRATED DEVICE(S) AND/OR THE COMPONENTS — 1615

COUPLE INTEGRATED DEVICE(S) AND/OR COMPONENT(S) TO A SECOND SURFACE OF THE SUBSTRATE — 1620

COUPLE SOLDER INTERCONNECTS TO THE SUBSTRATE — 1625

CROSS SECTIONAL PROFILE VIEW

CROSS SECTIONAL PROFILE VIEW

CROSS SECTIONAL PROFILE VIEW

1

PACKAGE SUBSTRATE AND/OR A BOARD WITH A SHARED POWER DISTRIBUTION NETWORK

FIELD

Various features relate to a board, a package and a substrate.

BACKGROUND

A package may include a substrate and integrated devices. These components are coupled together to provide a package that may perform various functions. The performance of a package and its components may depend on how power may be provided to the package and/or its components through a board. There is an ongoing need to provide packages with improved performances.

SUMMARY

Various features relate to a board, a package and a substrate.

One example provides a device comprising a substrate, a first integrated device coupled to a first surface of the substrate, a second integrated device coupled to the first surface of the substrate, a first passive device coupled to the substrate and a second passive device coupled to the substrate. The substrate includes at least one dielectric layer and a plurality of interconnects that are formed on at least a plurality of metal layers of the substrate. The plurality of metal layers include a first metal layer and a second metal layer. The plurality of interconnects include a power interconnect. The power interconnect is configured to be electrically coupled to power. The first integrated device, the first passive device, the second integrated device and the second passive device are configured to be electrically coupled to the power interconnect through a first plurality of interconnects from the plurality of interconnects. At least one interconnect from the first plurality of interconnects is configured to operate as an inductor configured to be electrically coupled to power. The first plurality of interconnects include a first interconnect on the first metal layer, a second interconnect on the second metal layer, and a via interconnect coupled to the first interconnect and the second interconnect.

One example provides a device comprising a board substrate, a first integrated device coupled to a first surface of the board substrate, a second integrated device coupled to the first surface of the board substrate, a first passive device coupled to a second surface of the board substrate and a second passive device coupled to the second surface of the board substrate. The board substrate comprises at least one dielectric layer and a plurality of interconnects that are formed on at least a plurality of metal layers of the board substrate. The plurality of metal layers include a first metal layer and a second metal layer. The plurality of interconnects include a power interconnect. The power interconnect is configured to be electrically coupled to power. The first integrated device, the first passive device, the second integrated device and the second passive device are configured to be electrically coupled to the power interconnect through a first plurality of interconnects from the plurality of interconnects. The first plurality of interconnects are configured to operate as an inductor configured to be electrically coupled to power, where the first plurality of interconnects include a first interconnect on the first metal layer, a second interconnect on the second metal layer, and a via interconnect coupled to the first interconnect and the second interconnect.

One example provides a device comprising a package substrate, a first integrated device coupled to a first surface of the package substrate, a second integrated device coupled to the first surface of the package substrate, a first passive device coupled to a second surface of the package substrate and a second passive device coupled to the second surface of the package substrate. The package substrate comprises at least one dielectric layer and a plurality of interconnects that are formed on at least a plurality of metal layers of the package substrate. The plurality of metal layers include a first metal layer and a second metal layer. The plurality of interconnects include a power interconnect. The power interconnect is configured to be electrically coupled to power. The first integrated device, the first passive device, the second integrated device and the second passive device are configured to be electrically coupled to the power interconnect through a first plurality of interconnects from the plurality of interconnects. The first plurality of interconnects are configured to operate as an inductor configured to be electrically coupled to power, where the first plurality of interconnects include a first interconnect on the first metal layer, a second interconnect on the second metal layer, and a via interconnect coupled to the first interconnect and the second interconnect.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 14A-14C illustrate an exemplary sequence for fabricating a substrate with interconnects.

FIGS. 15A-15B illustrate an exemplary sequence for fabricating a package comprising a package substrate and integrated devices.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Figure 1:
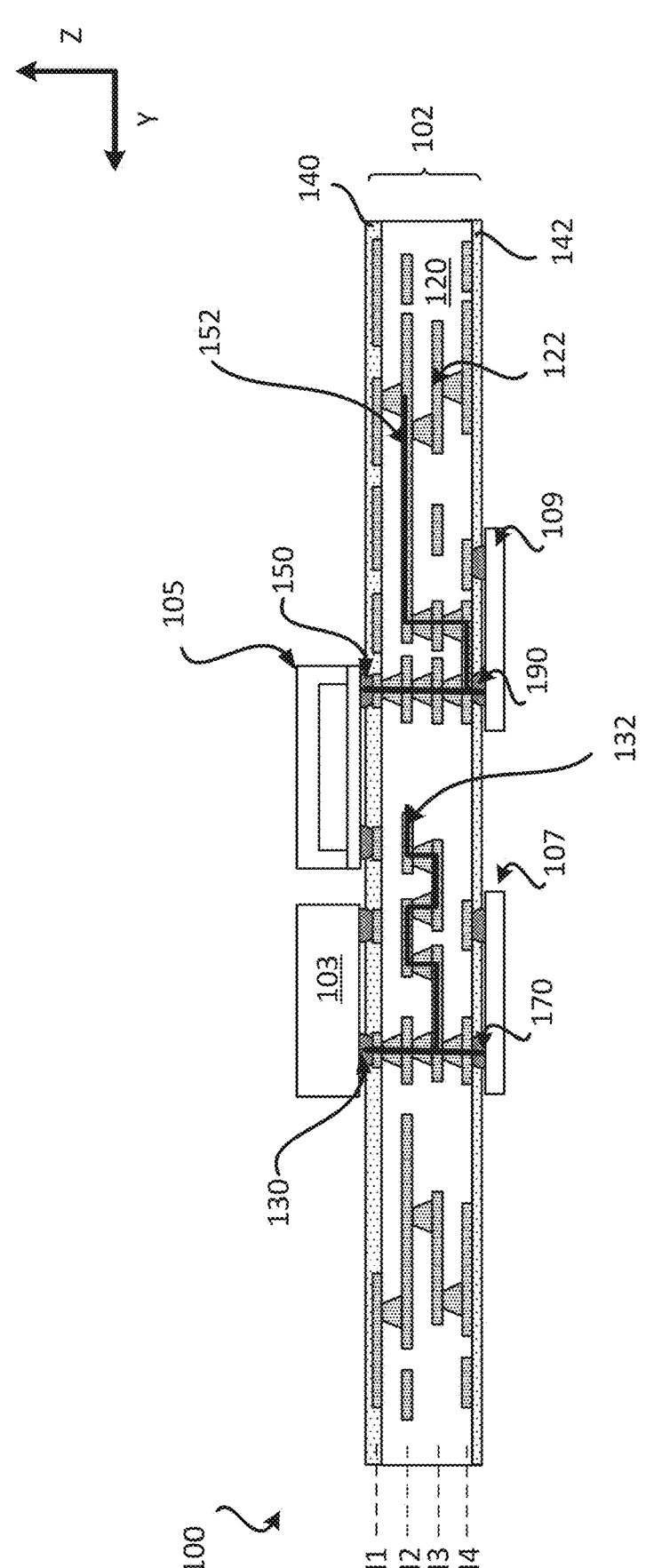
FIG. 1 illustrates a profile cross sectional view of integrated devices coupled to a board substrate.

The present disclosure describes a device that includes a substrate, a first integrated device coupled to a first surface of the substrate, a second integrated device coupled to the first surface of the substrate, a first passive device coupled to a second surface of the substrate and a second passive device coupled to the second surface of the substrate. The substrate comprises at least one dielectric layer and a plurality of interconnects that are formed on at least a plurality of metal layers of the substrate. The plurality of metal layers include a first metal layer and a second metal layer. The plurality of interconnects include a power interconnect. The power interconnect is configured to be electrically coupled to power. The first integrated device, the first passive device, the second integrated device and the second passive device are configured to be electrically coupled to the power interconnect through a first plurality of interconnects from the plurality of interconnects. The first plurality of interconnects are configured to operate as an inductor configured to be electrically coupled to power, where the first plurality of interconnects include a first interconnect on the first metal layer, a second interconnect on the second metal layer, and a via interconnect coupled to the first interconnect and the second interconnect. The substrate may be a board substrate. The substrate may be a package substrate. The plurality of interconnects are configured to provide a shared power distribution network for the first integrated device and the second integrated device. The plurality of interconnects are arranged and/or configured in such a way as to provide improved isolation of noise between the first integrated device and/or the second integrated device. Providing improved isolation of noise between the integrated devices may help improve the overall performance of the package and/or the integrated devices. Exemplary Board and Package Comprising Integrated Devices and a Substrate FIG. 1 illustrates a profile cross sectional view of a configuration 100 that includes a board substrate 102 (e.g., board, printed circuit board), an integrated device 103, an integrated device 105, a passive device 107, and a passive device 109. The integrated device 103 may be a first integrated device. The integrated device 105 may be a second integrated device. The integrated device 105 may be an integrated device package (e.g., flip chip) that includes a package substrate, a semiconductor die and an encapsulation layer. The passive device 107 may be a first passive device. The passive device 109 may be a second passive device. The passive device 107 and/or the passive device 109 may each include a capacitor (e.g., decoupling capacitor). The board substrate 102 may be configured to provide a shared power distribution network. The integrated device 103, the integrated device 105, the passive device 107 and the passive device 109 are configured to be coupled to a shared power distribution network.

The board substrate 102 includes at least one dielectric layer 120 (e.g., board dielectric layer) and a plurality of interconnects 122 (e.g., board interconnects). The board substrate 102 also includes a solder resist layer 140 and a solder resist layer 142. The board substrate 102 includes four (4) metal layers, where interconnects are located on the metal layers and between metal layers. However, as will be further described below, a board substrate may include a different number of metal layers (e.g., more than four metal layers). The board substrate 102 includes a first surface (e.g., top surface) and a second surface (e.g., bottom surface). The second surface of the board substrate 102 may be opposite to the first surface of the board substrate 102, and vice versa. The integrated device 103 is coupled to the first surface of the board substrate 102 through a plurality of solder interconnects 130. In some implementations, the integrated device 103 is coupled to the first surface of the board substrate 102 through a plurality of pillar interconnects (not shown) and a plurality of solder interconnects 130. The integrated device 105 is coupled to the first surface of the board substrate 102 through a plurality of solder interconnects 150. In some implementations, the integrated device 105 is coupled to the first surface of the board substrate 102 through a plurality of pillar interconnects (not shown) and a plurality of solder interconnects 150.

The passive device 107 is coupled to the second surface of the board substrate 102 through a plurality of solder interconnects 170. The passive device 109 is coupled to the second surface of the board substrate 102 through a plurality of solder interconnects 190. The integrated device 103, the integrated device 105, the passive device 107, and the passive device 109 may each be configured to be electrically coupled to one or more interconnects from the plurality of interconnects 122.

The configuration 100 may be configured to be electrically coupled to a power distribution network. The power distribution network may be configured to be electrically coupled to a power management integrated circuit (PMIC) (e.g., power management integrated device). The power distribution network may be a shared power distribution network for the integrated device 103 and the integrated device 105. For example, power for both the integrated device 103 and the integrated device 105 may be provided by and/or through a power management integrated circuit (PMIC). The power management integrated circuit (PMIC) may be coupled to the board substrate 102.

The passive device 107 is configured to be electrically coupled to the integrated device 103 through a first plurality of interconnects from the plurality of interconnects 122 of the board substrate 102. For example, an electrical path 132 between at least the passive device 107 and the integrated device 103 includes a first plurality of interconnects from the plurality of interconnects 122 of the board substrate 102. The electrical path 132 may represent at least part of an electrical path for power between a power management integrated circuit (PMIC) (not shown), the passive device 107 and the integrated device 103. For example, power from a power management integrated circuit (PMIC) may travel through interconnects on a metal layer (e.g., $2^{nd}$ metal layer), down towards another metal layer (e.g., $3^{rd}$ metal layer) through at least one via interconnect, along the another metal layer (e.g., $3^{rd}$ metal layer), up towards the metal layer (e.g., $2^{nd}$ metal layer) through at least one via interconnect, along the metal layer (e.g., $2^{nd}$ metal layer), down towards another metal layer (e.g., $3^{rd}$ metal layer) through at least one via interconnect, along the another metal layer (e.g., $3^{rd}$ metal layer), down towards a bottom metal layer (e.g., $4^{th}$ metal layer) through at least one via interconnect, through a solder interconnect from the plurality of solder interconnects 170 and towards a terminal of the passive device 107, and from the another metal layer (e.g., $3^{rd}$ metal layer) up towards the metal layer (e.g., $2^{nd}$ metal layer) through at least one via interconnect, up towards the top metal layer (e.g., $1^{st}$ metal layer) through at least one via interconnect and towards the integrated device 103 though at least one solder interconnect from the plurality of solder interconnects 130. In some implementations, another terminal of the passive device 107 may be configured to be electrically coupled to interconnects from the plurality of interconnects 122 that are configured to provide ground. It is noted that only part of the electrical path 132 is shown. The electrical path 132 may be coupled to a power management integrated circuit (PMIC) through various possible interconnects. FIG. 1 illustrates that the electrical path 132 may extend up and down several times through several metal layers and through via interconnects between metal layers, to create additional inductance to help isolate power that is provided to two different integrated devices in a shared power distribution network. The additional inductance in the electrical may be located along an electrical path between the passive device 107 and the passive device 109. The additional inductance in the electrical may be located along an electrical path between the integrated device 103 and the integrated device 105. The additional inductance in the electrical may be located along an electrical path between the passive device 107, the passive device 109, the integrated device 103 and the integrated device 105.

It is noted that (i) a first metal layer of the board substrate (e.g., 102, 202), as used in the disclosure, may mean any of the metal layers of the board substrate (e.g., 102, 202), (ii) a second metal layer of the board substrate (e.g., 102, 202), as used in the disclosure, may mean any of the metal layers of the board substrate (e.g., 102, 202), (iii) a third metal layer of the board substrate (e.g., 102, 202), as used in the disclosure, may mean any of the metal layers of the board substrate (e.g., 102, 202), and (iv) a fourth metal layer of the board substrate (e.g., 102, 202), as used in the disclosure, may mean any of the metal layers of the board substrate (e.g., 102, 202).

The passive device 109 is configured to be electrically coupled to the integrated device 105 through a second plurality of interconnects from the plurality of interconnects 122 of the board substrate 102. For example, an electrical path 152 between at least the passive device 109 and the integrated device 105 includes a second plurality of interconnects from the plurality of interconnects 122 of the board substrate 102. The electrical path 152 may represent at least part of an electrical path for power between a power management integrated circuit (PMIC) (not shown), the passive device 109 and the integrated device 105. For example, power from a power management integrated circuit (PMIC) may travel through interconnects on a metal layer (e.g., $2^{nd}$ metal layer) down towards another metal layer (e.g., $3^{rd}$ metal layer) through at least one via interconnect, down towards a bottom metal layer (e.g., $4^{th}$ metal layer) through at least one via interconnect, through a solder interconnect from the plurality of solder interconnects 190 and towards a terminal of the passive device 109, and from the bottom metal layer (e.g., $4^{th}$ metal layer) towards the another metal layer (e.g., $3^{rd}$ metal layer) through at least one via interconnect, up towards the metal layer (e.g., $2^{nd}$ metal layer) through at least one via interconnect, up towards the top metal layer (e.g., $1^{st}$ metal layer) through at least one via interconnect and towards the integrated device 105 through at least one solder interconnect from the plurality of solder interconnects 150. In some implementations, another terminal of the passive device 109 may be configured to be electrically coupled to interconnects from the plurality of interconnects 122 that are configured to provide ground. It is noted that only part of the electrical path 152 is shown. The electrical path 152 may be coupled to a power management integrated circuit (PMIC) through various possible interconnects. FIG. 1 illustrates that the electrical path 152 may extend up and down at least once through several metal layers and through via interconnects between metal layers, to create additional inductance to help isolate power that is provided to two different integrated devices in a shared power distribution network. The electrical path 132 and the electrical path 152 may be configured to be electrically coupled to each other. In some implementations, the electrical path 132 and the electrical path 152 may be considered part of the same electrical path. In some implementations, the second plurality of interconnects from the plurality of interconnects 122 may be considered part of the first plurality of interconnects from the plurality of interconnects 122, and vice versa.

The passive device 107 and the passive device 109 may share a power distribution network. For example, the passive device 107 and the passive device 109 may both be directly or indirectly coupled to at least one same interconnect (e.g., interconnects on $2^{nd}$ metal layer) that are configured to provide power. In some implementations, interconnects on the $2^{nd}$ metal layer may include a power interconnect (e.g., wide trace interconnect, plane interconnect, rail interconnect) that is part of the electrical path 132 and the electrical path 152. Thus, the electrical path 132 and the electrical path 152 may be configured to be electrically coupled to each other. Power may travel through a power management integrated circuit (PMIC) and interconnects from the board substrate 102, where power is split to the passive device 107, the passive device 109, the integrated device 103 and the integrated device 105. For example, power may be provided to the passive device 107 and the integrated device 103, and power may be provided to the passive device 109 and the integrated device 105.

The electrical path 132 and/or the electrical path 152 may include a plurality of interconnects from the plurality of interconnects 122 that are configured as at least one inductor defined by at least one interconnect on one metal layer, another interconnect on another metal layer and at least one via interconnect. The inductor is integrated in the board substrate 102 and is configured to be coupled to power. The inductor may include one or more multiple windings (from interconnects) up and down two or more metal layers of the board substrate 102. The inductor that is defined by at least one via interconnect (e.g., additional via interconnect) may be located along an electrical path that is located between the passive device 107 and the passive device 109. The inductor that is defined by at least one via interconnect (e.g., additional via interconnect) may be located along an electrical path that is located between the integrated device 103 and the integrated device 105. Thus, the additional windings (e.g., vertical windings and/or horizontal windings) of interconnects that is part of an electrical path between the passive device 107 and the passive device 109 and is part of an electrical path between the integrated device 103 and the integrated device 105, help increase the inductance, which helps reduce noise transfer between integrated devices. The additional windings (e.g., vertical windings and/or horizontal windings) of interconnects may be located along a common path (e.g., common electrical path) between the passive device 107, the passive device 109, the integrated device 103 and the integrated device 105. A more detailed example of a common path is further described and illustrated in FIG. 5.

Figure 2:
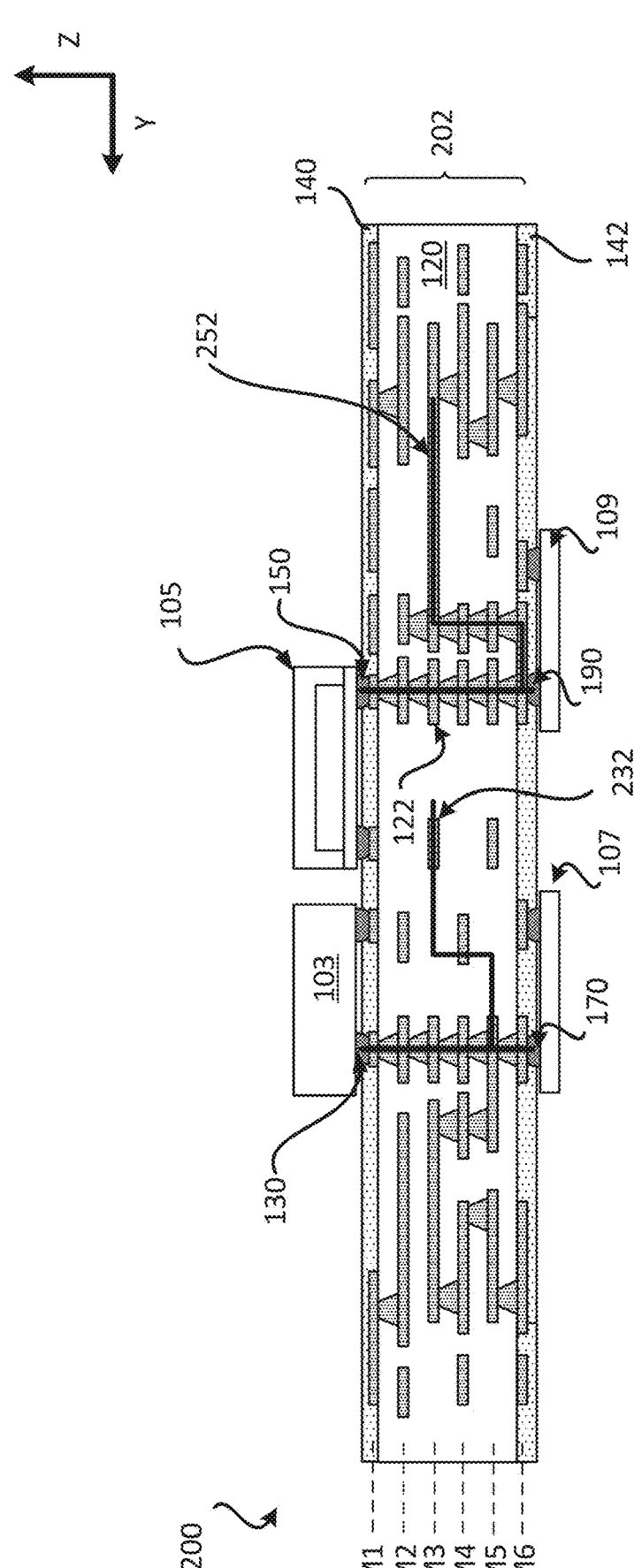
FIG. 2 illustrates a profile cross sectional view of integrated devices coupled to a board substrate.

FIG. 2 illustrates a profile cross sectional view of a configuration 200 that includes a board substrate 202, the integrated device 103, the integrated device 105, the passive device 107 and the passive device 109. The integrated device 103, the integrated device 105, the passive device 107 and the passive device 109 may be coupled to the board substrate 202 in a similar manner as the board substrate 102 of FIG. 1. The board substrate 202 may be similar to the board substrate 102. However, the board substrate 202 includes a different number of metal layers, where interconnects are located on the metal layers and between metal layers.

The board substrate 202 includes at least one dielectric layer 120 (e.g., board dielectric layer) and a plurality of interconnects 122. The board substrate 102 includes at least six (6) metal layers. The board substrate 202 includes a first surface (e.g., top surface) and a second surface (e.g., bottom surface). The second surface of the board substrate 202 may be opposite to the first surface of the board substrate 202, and vice versa. The integrated device 103 is coupled to the first surface of the board substrate 202 through a plurality of solder interconnects 130. In some implementations, the integrated device 103 is coupled to the first surface of the board substrate 202 through a plurality of pillar interconnects (not shown) and a plurality of solder interconnects 130. The integrated device 105 is coupled to the first surface of the board substrate 202 through a plurality of solder interconnects 150. In some implementations, the integrated device 105 is coupled to the first surface of the board substrate 202 through a plurality of pillar interconnects (not shown) and a plurality of solder interconnects 150.

The passive device 107 is coupled to the second surface of the board substrate 202 through a plurality of solder interconnects 170. The passive device 109 is coupled to the second surface of the board substrate 202 through a plurality of solder interconnects 190. The integrated device 103, the integrated device 105, the passive device 107, and the passive device 109 may each be configured to be electrically coupled to one or more interconnects from the plurality of interconnects 122.

The configuration 200 may be configured to be electrically coupled to a power distribution network. The power distribution network may be configured to be electrically coupled to a power management integrated circuit (PMIC) (e.g., power management integrated device). The power distribution network may be a shared power distribution network for the integrated device 103 and the integrated device 105.

The passive device 107 is configured to be electrically coupled to the integrated device 103 through a first plurality of interconnects from the plurality of interconnects 122 of the board substrate 202. For example, an electrical path 232 between at least the passive device 107 and the integrated device 103 includes a first plurality of interconnects from the plurality of interconnects 122 of the board substrate 202. The electrical path 232 may represent at least part of an electrical path for power between a power management integrated circuit (PMIC) (not shown), the passive device 107 and the integrated device 103. For example, power from a power management integrated circuit (PMIC) may travel through interconnects on a metal layer (e.g., $3^{rd}$ metal layer), down towards another metal layer (e.g., $4^{th}$ metal layer) through at least one via interconnect, down towards another metal layer (e.g., 511 metal layer) through at least one via interconnect, along the another metal layer (e.g., $5^{th}$ metal layer), down towards a bottom metal layer (e.g., $6^{th}$ metal layer) through at least one via interconnect, through a solder interconnect from the plurality of solder interconnects 170 and towards a terminal of the passive device 107, and from the another metal layer (e.g., $5^{th}$ metal layer) up towards another metal layer (e.g., $4^{th}$ metal layer) through at least one via interconnect, up towards another metal layer (e.g., $3^{rd}$ metal layer) through at least one via interconnect, up towards another metal layer (e.g., $2^{nd}$ metal layer) through at least one via interconnect, up towards the top metal layer (e.g., $1^{st}$ metal layer) through at least one via interconnect and towards the integrated device 103 though at least one solder interconnect from the plurality of solder interconnects 130. In some implementations, another terminal of the passive device 107 may be configured to be electrically coupled to interconnects from the plurality of interconnects 122 that are configured to provide ground. It is noted that only part of the electrical path 232 is shown. The electrical path 232 may be coupled to a power management integrated circuit (PMIC) through various possible interconnects.

It is noted that (i) a first metal layer of the board substrate (e.g., 102, 202), as used in the disclosure, may mean any of the metal layers of the board substrate (e.g., 102, 202), (ii) a second metal layer of the board substrate (e.g., 102, 202), as used in the disclosure, may mean any of the metal layers of the board substrate (e.g., 102, 202), (iii) a third metal layer of the board substrate (e.g., 102, 202), as used in the disclosure, may mean any of the metal layers of the board substrate (e.g., 102, 202), (iv) a fourth metal layer of the board substrate (e.g., 102, 202), as used in the disclosure, may mean any of the metal layers of the board substrate (e.g., 102, 202). (v) a fifth metal layer of the board substrate (e.g., 202), as used in the disclosure, may mean any of the metal layers of the board substrate (e.g., 202), (vi) a sixth metal layer of the board substrate (e.g., 202), as used in the disclosure, may mean any of the metal layers of the board substrate (e.g., 202), etc. . . . .

The passive device 109 is configured to be electrically coupled to the integrated device 105 through a second plurality of interconnects from the plurality of interconnects 122 of the board substrate 202. For example, an electrical path 252 between at least the passive device 109 and the integrated device 105 includes a second plurality of interconnects from the plurality of interconnects 122 of the board substrate 202. The electrical path 252 may represent at least part of an electrical path for power between a power management integrated circuit (PMIC) (not shown), the passive device 109 and the integrated device 105. For example, power from a power management integrated circuit (PMIC) may travel through interconnects on a metal layer (e.g., $3^{rd}$ metal layer), down towards another metal layer (e.g., $4^{th}$ metal layer) through at least one via interconnect, down towards another metal layer (e.g., $5^{th}$ metal layer) through at least one via interconnect, down towards a bottom metal layer (e.g., $6^{th}$ metal layer) through at least one via interconnect, along an interconnect of the bottom metal layer (e.g., $6^{th}$ metal layer), through a solder interconnect from the plurality of solder interconnects 190 and towards a terminal of the passive device 109, and from the bottom metal layer (e.g., $6^{th}$ metal layer) up towards another metal layer (e.g., $5^{th}$ metal layer) through at least one via interconnect, up towards another metal layer (e.g., $4^{th}$ metal layer) through at least one via interconnect, up towards another metal layer (e.g., $3^{rd}$ metal layer) through at least one via interconnect, up towards another metal layer (e.g., $2^{nd}$ metal layer) through at least one via interconnect, up towards the top metal layer (e.g., $1^{st}$ metal layer) through at least one via interconnect and towards the integrated device 105 though at least one solder interconnect from the plurality of solder interconnects 150. In some implementations, another terminal of the passive device 109 may be configured to be electrically coupled to interconnects from the plurality of interconnects 122 that are configured to provide ground. It is noted that only part of the electrical path 252 is shown. The electrical path 252 may be coupled to a power management integrated circuit (PMIC) through various possible interconnects.

The passive device 107 and the passive device 109 may share a power distribution network. For example, the passive device 107 and the passive device 109 may both be directly or indirectly coupled to a same set of interconnects (e.g., interconnects on $3^{rd}$ metal layer) that are configured to provide power. In some implementations, interconnects on the $3^{rd}$ metal layer may include a power interconnect (e.g., wide power interconnect, wide trace interconnect, plane interconnect, rail interconnect) that is part of the electrical path 232 and the electrical path 252. The electrical path 232 may be configured to be coupled to the electrical path 252. The electrical path 232 and the electrical path 252 may be considered part of the same electrical path. In some implementations, the second plurality of interconnects from the plurality of interconnects 122 may be considered part of the first plurality of interconnects from the plurality of interconnects 122, and vice versa.

The electrical path 232 and/or the electrical path 252 may include a plurality of interconnects from the plurality of interconnects 122 that are configured as at least one inductor defined by at least one interconnect on one metal layer, another interconnect on another metal layer and at least one via interconnect. The inductor is integrated in the board substrate 202 and is configured to be coupled to power. The inductor may include one or more multiple windings (from interconnects) up and down two or more metal layers of the board substrate 202.

FIGS. 1 and 2 illustrate that the electrical paths for power are not limited to any specific metal layers of the board substrate (e.g., board, printed circuit board). Thus, any metal layer may be used for the electrical paths. What FIGS. 1 and 2 illustrate is that instead of taking the most direct path to the integrated device 103 and/or the integrated device 105, power may first be directed closer and/or near a passive device (e.g., 107, 109) (and thus vertically away from the integrated device 103 and/or the integrated device 105), before being directed towards the integrated device 103 and/or the integrated device 105. For example, one electrical path may be lengthened in the board substrate by extending the electrical paths up and down through several metal layers, which creates additional inductance that helps with isolation between power to different integrated devices in a shared power distribution network. As will be further described below in at least FIG. 10, this design and/or approach of routing power may help improve power delivery, and provide improved isolation (e.g., by adding inductance through interconnects) between power to different integrated devices, and reducing noise transfer between integrated devices.

In some implementations, other types of substrates may implement the designs and/or configurations shown and described in the disclosure. For example, the above design may be implemented in a package substrate instead of and/or with a board substrate.

Figure 3:
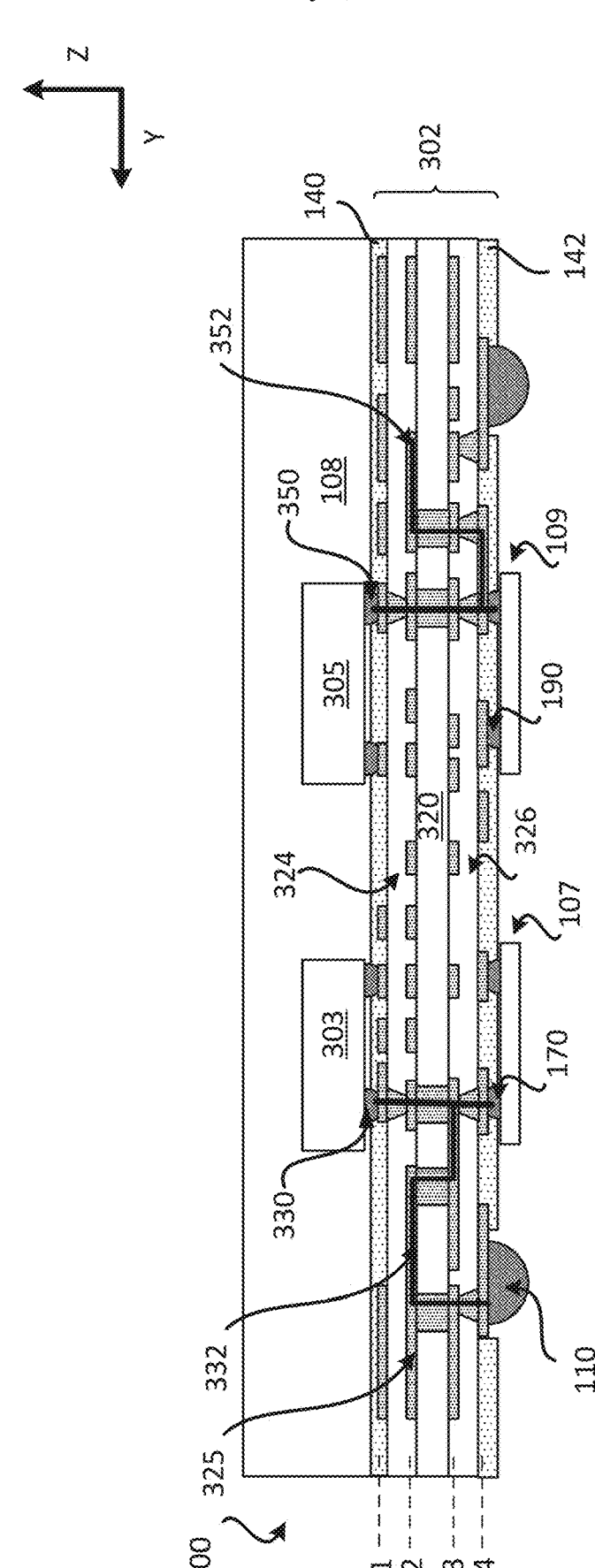
FIG. 3 illustrates a profile cross sectional view of an exemplary package that includes a package substrate and integrated devices.

FIG. 3 illustrates a profile cross sectional view of a package 300 that includes a substrate 302, the integrated device 303, the integrated device 305, the passive device 107, the passive device 109, and the encapsulation layer 108. The integrated device 303 is coupled to a first surface of the substrate 302 through a plurality of solder interconnects 330. The integrated device 305 is coupled to a first surface of the substrate 302 through a plurality of solder interconnects 350. The passive device 107 is coupled to a second surface of the substrate 302 through a plurality of solder interconnects 170. The passive device 109 is coupled to a second surface of the substrate 302 through a plurality of solder interconnects 190. The encapsulation layer 108 may be coupled to the substrate 302, the integrated device 303 and the integrated device 305. The encapsulation layer 108 is coupled to the first surface of the board substrate 102. The encapsulation layer 108 may encapsulate the integrated device 103 and the integrated device 105. The encapsulation layer 108 may include a mold, a resin and/or an epoxy. The encapsulation layer 108 may be a means for encapsulation. The encapsulation layer 108 may be provided by using a compression and transfer molding process, a sheet molding process, or a liquid molding process.

The substrate 302 may be a package substrate. The substrate 302 may be cored substrate. The substrate 302 includes a core layer 320, at least one dielectric layer 324, at least one dielectric layer 326, and a plurality of interconnects 325. The plurality of interconnects 325 may be located in, above and/or below the at least one dielectric layer 324 and the at least one dielectric layer 326. The plurality of interconnects 325 may include a plurality of core interconnects located in the core layer 320. In some implementations, an embedded trace substrate (ETS) may be used for the package 300. A plurality of solder interconnects 110 are coupled to the plurality of interconnects 325 of the substrate 302.

The package 300 may be configured to be electrically coupled to a power distribution network. The power distribution network may be configured to be electrically coupled to a power management integrated circuit (PMIC) (e.g., power management integrated device). The power distribution network may be a shared power distribution network for the integrated device 303 and the integrated device 305. For example, power for both the integrated device 303 and the integrated device 305 may be provided by and/or through a power management integrated circuit (PMIC).

The passive device 107 is configured to be electrically coupled to the integrated device 303 through a first plurality of interconnects from the plurality of interconnects 325 of the substrate 302. For example, an electrical path 332 between at least the passive device 107 and the integrated device 303 includes a first plurality of interconnects from the plurality of interconnects 325 of the substrate 302. The electrical path 332 may represent at least part of an electrical path for power between a power management integrated circuit (PMIC) (not shown), the passive device 107 and the integrated device 303. For example, power from a power management integrated circuit (PMIC) may travel through a solder interconnect from the plurality of solder interconnects 110, through interconnects of several metal layers, through interconnects on a metal layer (e.g., $2^{nd}$ metal layer), down towards another metal layer (e.g., $3^{rd}$ metal layer) through at least one core interconnect (e.g., via core interconnect), along the another metal layer (e.g., $3^{rd}$ metal layer), down towards a bottom metal layer (e.g., $4^{th}$ metal layer) through at least one via interconnect, through a solder interconnect from the plurality of solder interconnects 170 and towards a terminal of the passive device 107, and from the another metal layer (e.g., $3^{rd}$ metal layer) up towards the metal layer (e.g., $2^{nd}$ metal layer) through at least one via interconnect, up towards the top metal layer (e.g., $1^{st}$ metal layer) through at least one via interconnect and towards the integrated device 303 though at least one solder interconnect from the plurality of solder interconnects 130. In some implementations, another terminal of the passive device 107 may be configured to be electrically coupled to interconnects from the plurality of interconnects 325 that are configured to provide ground. It is noted that only part of the electrical path 332 is shown. The electrical path 332 may be coupled to a power management integrated circuit (PMIC) through various possible interconnects. Power may enter through the package 300 through at least one solder interconnect from the plurality of solder interconnects 110.

The electrical path 332 and/or the electrical path 352 may include a plurality of interconnects from the plurality of interconnects 325 that are configured as an inductor defined by at least one interconnect on one metal layer, another interconnect on another metal layer and at least one via interconnect. The inductor is integrated in the package substrate 302 and is configured to be coupled to power. The inductor may include one or more multiple windings (from interconnects) up and down two or more metal layers of the package substrate 302.

It is noted that (i) a first metal layer of the substrate (e.g., 302, 402), as used in the disclosure, may mean any of the metal layers of the substrate (e.g., 302, 402), (ii) a second metal layer of the substrate (e.g., 302, 402), as used in the disclosure, may mean any of the metal layers of the substrate (e.g., 302, 402). (iii) a third metal layer of the substrate (e.g., 302, 402), as used in the disclosure, may mean any of the metal layers of the substrate (e.g., 302, 402). (iv) a fourth metal layer of the substrate (e.g., 302, 402), as used in the disclosure, may mean any of the metal layers of the substrate (e.g., 302, 402). (v) a fifth metal layer of the substrate (e.g., 402), as used in the disclosure, may mean any of the metal layers of the substrate (e.g., 402), (vi) a sixth metal layer of the substrate (e.g., 402), as used in the disclosure, may mean any of the metal layers of the substrate (e.g., 402), etc. . . . . The substrate 302 and/or the substrate 402 may be a package substrate.

The passive device 109 is configured to be electrically coupled to the integrated device 305 through a second plurality of interconnects from the plurality of interconnects 325 of the substrate 302. For example, an electrical path 352 between at least the passive device 109 and the integrated device 305 includes a second plurality of interconnects from the plurality of interconnects 325 of the substrate 302. The electrical path 352 may represent at least part of an electrical path for power between power management integrated circuit (PMIC) (not shown), the passive device 109 and the integrated device 305. For example, power from a power management integrated circuit (PMIC) may travel through interconnects on a metal layer (e.g., $2^{nd}$ metal layer), down towards another metal layer (e.g., $3^{rd}$ metal layer) through at least one core interconnect (e.g., via core interconnect), down towards a bottom metal layer (e.g., $4^{th}$ metal layer) through at least one via interconnect, along the bottom metal layer (e.g., $4^{th}$ metal layer), through a solder interconnect from the plurality of solder interconnects 190 and towards a terminal of the passive device 109, and from the bottom metal layer (e.g., $4^{th}$ metal layer) up towards the metal layer (e.g., $3^{rd}$ metal layer) through at least one via interconnect, up towards the metal layer (e.g., $2^{nd}$ metal layer) through at least one via interconnect, up towards the top metal layer (e.g., $1^{st}$ metal layer) through at least one via interconnect and towards the integrated device 305 though at least one solder interconnect from the plurality of solder interconnects 150. In some implementations, another terminal of the passive device 109 may be configured to be electrically coupled to interconnects from the plurality of interconnects 325 that are configured to provide ground. It is noted that only part of the electrical path 352 is shown. The electrical path 352 may be coupled to a power management integrated circuit (PMIC) through various possible interconnects. The electrical path 332 may be configured to be electrically coupled to the electrical path 352. In some implementations, the electrical path 332 and the electrical path 352 may be considered part of the same electrical path. In some implementations, the second plurality of interconnects from the plurality of interconnects 325 may be considered part of the first plurality of interconnects from the plurality of interconnects 325, and vice versa.

The electrical path 332 and/or the electrical path 352 may include a plurality of interconnects from the plurality of interconnects 325 that are configured as at least one inductor defined by at least one interconnect on one metal layer, another interconnect on another metal layer and at least one via interconnect. The inductor is integrated in the substrate 302 and is configured to be coupled to power. The inductor may include one or more multiple windings (from interconnects) up and down two or more metal layers of the substrate 302. The inductor that is defined by at least one via interconnect (e.g., additional via interconnect) may be located along an electrical path that is located between the passive device 107 and the passive device 109. The inductor that is defined by at least one via interconnect (e.g., additional via interconnect) may be located along an electrical path that is located between the integrated device 303 and the integrated device 305. The inductor is located in a common path (e.g., common electrical path) between the integrated device 103, the integrated device 105, the passive device 107 and the passive device 109. A more detailed example of a common path is further described and illustrated in FIG. 5. Thus, the additional windings along the common path (e.g., vertical windings and/or horizontal windings) of interconnects that is part of an electrical path between the passive device 107 and the passive device 109 and that is part of an electrical path between the integrated device 303 and the integrated device 305, help increase the inductance, which helps reduce noise transfer between integrated devices.

Figure 4:
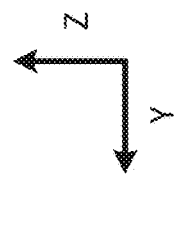
FIG. 4 illustrates a profile cross sectional view of an exemplary package that includes a package substrate and integrated devices.
Figure 4:
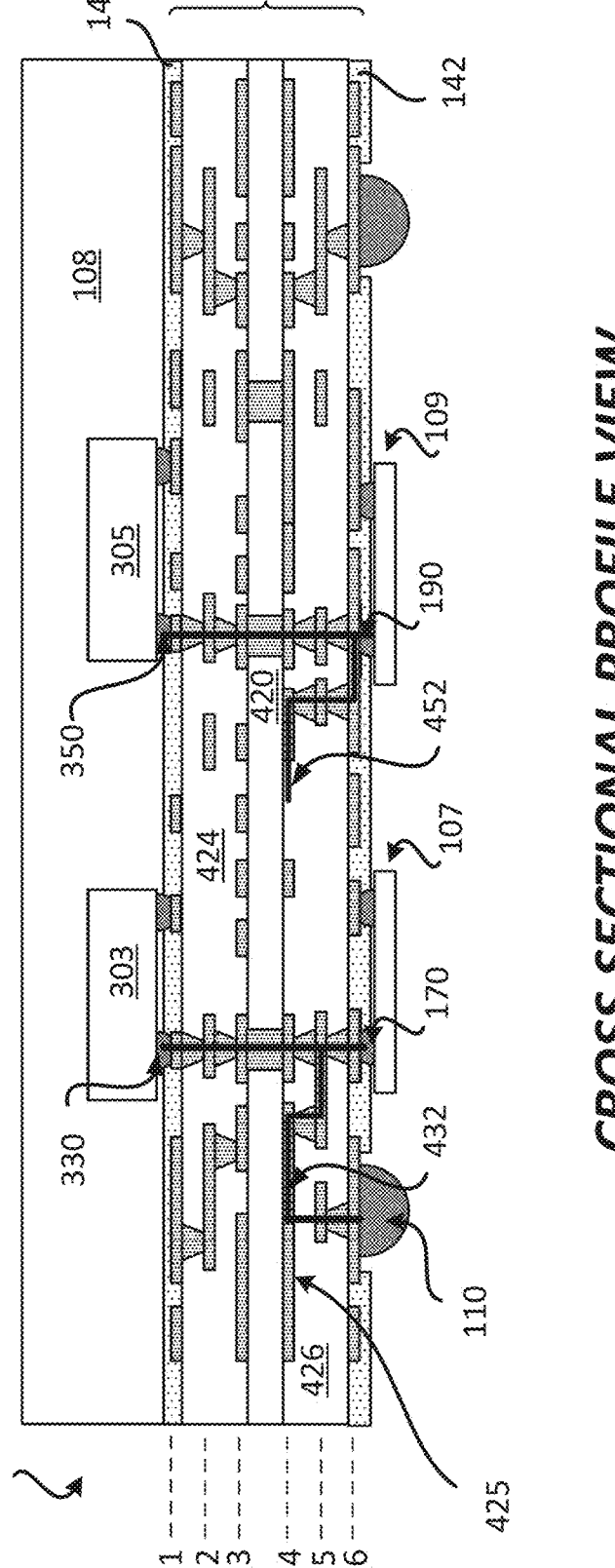

FIG. 4 illustrates a profile cross sectional view of a package 400 that includes a substrate 402, the integrated device 303, the integrated device 305, the passive device 107, the passive device 109, and the encapsulation layer 108. The integrated device 303, the integrated device 305, the passive device 107, the passive device 109, and the encapsulation layer 108 may be coupled to the substrate 302 in a similar manner as the substrate 302 of FIG. 3. The integrated device 303 is coupled to a first surface of the substrate 402 through a plurality of solder interconnects 330. The integrated device 305 is coupled to a first surface of the substrate 402 through a plurality of solder interconnects 350.

The substrate 402 may be a package substrate. The substrate 402 may be a cored substrate. The substrate 402 includes a core layer 420, at least one dielectric layer 424, at least one dielectric layer 426, and a plurality of interconnects 425. The plurality of interconnects 425 may be located in, above and/or below the at least one dielectric layer 424 and the at least one dielectric layer 326. The plurality of interconnects 345 may include a plurality of core interconnects located in the core layer 420. The substrate 402 is similar to the substrate 302. However, the substrate 402 includes more metal layers with interconnects located on the metal layers.

The package 400 may be configured to be electrically coupled to a power distribution network. The power distribution network may be configured to be electrically coupled to a power management integrated circuit (PMIC) (e.g., power management integrated device). The power distribution network may be a shared power distribution network for the integrated device 303 and the integrated device 305. For example, power for both the integrated device 303 and the integrated device 305 may be provided by and/or through a power management integrated circuit (PMIC).

The passive device 107 is configured to be electrically coupled to the integrated device 303 through a first plurality of interconnects from the plurality of interconnects 425 of the substrate 402. For example, an electrical path 432 between at least the passive device 107 and the integrated device 303 includes a first plurality of interconnects from the plurality of interconnects 425 of the substrate 402. The electrical path 432 may represent at least part of an electrical path for power between a power management integrated circuit (PMIC) (not shown), the passive device 107 and the integrated device 303. For example, power from a power management integrated circuit (PMIC) may travel through a solder interconnect from the plurality of solder interconnects 110, through interconnects on several metal layers, through interconnects on a metal layer (e.g., $4^{th}$ metal layer), down towards another metal layer (e.g., $5^{th}$ metal layer) through at least one via interconnect, along the another metal layer (e.g., $5^{th}$ metal layer), down towards a bottom metal layer (e.g., $6^{th}$ metal layer) through at least one via interconnect, through a solder interconnect from the plurality of solder interconnects 170 and towards a terminal of the passive device 107, and from the another metal layer (e.g., $5^{th}$ metal layer) up towards the metal layer (e.g., $4^{th}$ metal layer) through at least one via interconnect, up towards the metal layer (e.g., $3^{rd}$ metal layer) through at least one core interconnect (e.g., via core interconnect), up towards the metal layer (e.g., $2^{nd}$ metal layer) through at least one via interconnect, up towards the top metal layer (e.g., $1^{st}$ metal layer) through at least one via interconnect and towards the integrated device 303 though at least one solder interconnect from the plurality of solder interconnects 130. In some implementations, another terminal of the passive device 107 may be configured to be electrically coupled to interconnects from the plurality of interconnects 425 that are configured to provide ground. It is noted that only part of the electrical path 432 is shown. The electrical path 432 may be coupled to a power management integrated circuit (PMIC) through various possible interconnects.

The passive device 109 is configured to be electrically coupled to the integrated device 305 through a second plurality of interconnects from the plurality of interconnects 425 of the substrate 402. For example, an electrical path 452 between at least the passive device 109 and the integrated device 305 includes a second plurality of interconnects from the plurality of interconnects 425 of the substrate 402. The electrical path 452 may represent at least part of an electrical path for power between a power management integrated circuit (PMIC) (not shown), the passive device 109 and the integrated device 305. For example, power from a power management integrated circuit (PMIC) may travel through interconnects on a metal layer (e.g., $4^{th}$ metal layer), down towards another metal layer (e.g., $5^{th}$ metal layer) through at least one via interconnect, down towards a bottom metal layer (e.g., $6^{th}$ metal layer) through at least one via interconnect, along the bottom metal layer (e.g., $6^{th}$ metal layer), through a solder interconnect from the plurality of solder interconnects 190 and towards a terminal of the passive device 109, and from the bottom metal layer (e.g., $6^{th}$ metal layer) up towards the metal layer (e.g., $5^{th}$ metal layer) through at least one via interconnect, up towards the metal layer (e.g., $4^{th}$ metal layer) through at least one via interconnect, up towards the metal layer (e.g., $3^{rd}$ metal layer) through at least one core interconnect (e.g., via core interconnect), up towards the metal layer (e.g., $2^{nd}$ metal layer) through at least one via interconnect, up towards the top metal layer (e.g., $1^{st}$ metal layer) through at least one via interconnect and towards the integrated device 305 though at least one solder interconnect from the plurality of solder interconnects 150. In some implementations, another terminal of the passive device 109 may be configured to be electrically coupled to interconnects from the plurality of interconnects 425 that are configured to provide ground. It is noted that only part of the electrical path 452 is shown. The electrical path 452 may be coupled to a power management integrated circuit (PMIC) through various possible interconnects. The electrical path 432 may be configured to be electrically coupled to the electrical path 452. The electrical path 432 and the electrical path 452 may be considered part of the same electrical path. In some implementations, the second plurality of interconnects from the plurality of interconnects 122 may be considered part of the first plurality of interconnects from the plurality of interconnects 122, and vice versa.

The electrical path 432 and/or the electrical path 452 may include a plurality of interconnects from the plurality of interconnects 425 that are configured as at least one inductor defined by at least one interconnect on one metal layer, another interconnect on another metal layer and at least one via interconnect. The inductor is integrated in the package substrate 402 and is configured to be coupled to power. The inductor may include one or more windings (from interconnects) up and down two or more metal layers of the package substrate 402. The inductor that is defined by at least one via interconnect (e.g., additional via interconnect) may be located along an electrical path that is located between the passive device 107 and the passive device 109. The inductor that is defined by at least one via interconnect (e.g., additional via interconnect) may be located along an electrical path that is located between the integrated device 303 and the integrated device 305. The inductor is located in/along a common path between the integrated device 303, the integrated device 305, the passive device 107 and the passive device 109. Thus, the additional windings along the common path (e.g., vertical windings and/or horizontal windings) of interconnects that is part of an electrical path between the passive device 107 and the passive device 109 and that is part of an electrical path between the integrated device 303 and the integrated device 305, help increase the inductance, which helps reduce noise transfer between integrated devices. A more detailed example of a common path is further described and illustrated in FIG. 5.

Figure 5:
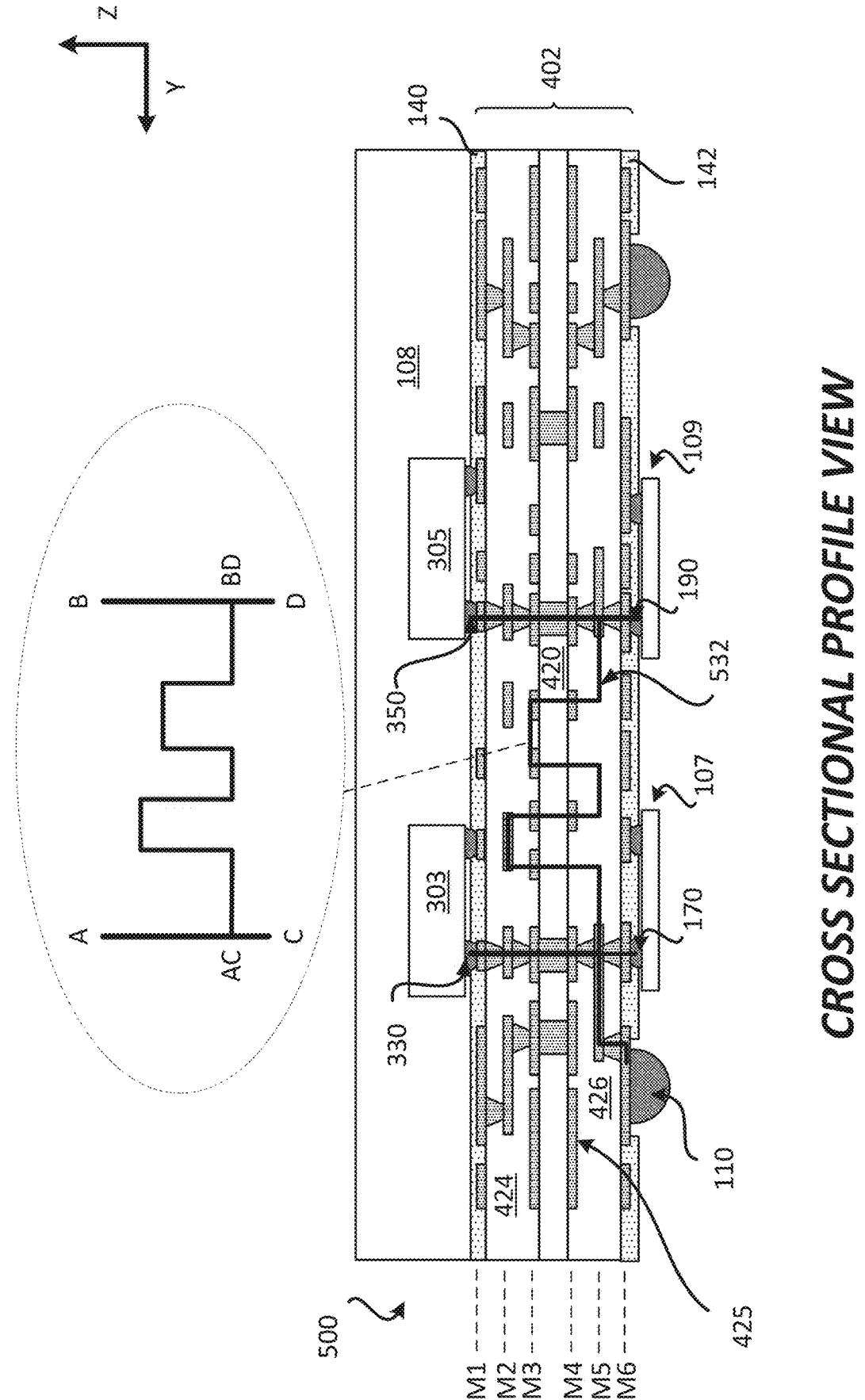
FIG. 5 illustrates a profile cross sectional view of an exemplary package that includes a package substrate and integrated devices.

FIG. 5 illustrates a profile cross sectional view of a package 500 that includes the substrate 402, the integrated device 303, the integrated device 305, the passive device 107, the passive device 109, and the encapsulation layer 108. The integrated device 303, the integrated device 305, the passive device 107, the passive device 109, and the encapsulation layer 108 may be coupled to the substrate 402 in a similar manner as the package substrate 302 of FIG. 3. The integrated device 303 is coupled to a first surface of the substrate 402 through a plurality of solder interconnects 330. The integrated device 305 is coupled to a first surface of the substrate 402 through a plurality of solder interconnects 350.

FIG. 5 illustrates another configuration of how electrical paths may be provided between the integrated devices and/or passive devices. In particular, the electrical path 532 may be configured to be electrically coupled to the passive device 107, the passive device 109, the integrated device 303 and the integrated device 305.

The passive device 107 is configured to be electrically coupled to the integrated device 303 through a first plurality of interconnects from the plurality of interconnects 425 of the substrate 402. For example, an electrical path 532 between at least the passive device 107 and the integrated device 303 includes a first plurality of interconnects from the plurality of interconnects 425 of the substrate 402. The electrical path 532 may represent at least part of an electrical path for power between a power management integrated circuit (PMIC) (not shown), the passive device 107 and the integrated device 303. For example, power from a power management integrated circuit (PMIC) may travel from a solder interconnect from the plurality of solder interconnects 110, through interconnects on a bottom metal layer (e.g., $6^{th}$ metal layer), up towards interconnects on a metal layer (e.g., $5^{th}$ metal layer), through interconnects on a metal layer (e.g., $5^{th}$ metal layer), down towards a bottom metal layer (e.g., $6^{th}$ metal layer) through at least one via interconnect, through a solder interconnect from the plurality of solder interconnects 170 and towards a terminal of the passive device 107, and from the interconnects on the metal layer (e.g., $5^{th}$ metal layer) up towards the metal layer (e.g., $4^{th}$ metal layer) through at least one via interconnect, up towards the metal layer (e.g., $3^{rd}$ metal layer) through at least one core interconnect (e.g., via core interconnect), up towards the metal layer (e.g., $2^{nd}$ metal layer) through at least one via interconnect, up towards the top metal layer (e.g., $1^{st}$ metal layer) through at least one via interconnect and towards the integrated device 303 though at least one solder interconnect from the plurality of solder interconnects 130. In some implementations, another terminal of the passive device 107 may be configured to be electrically coupled to interconnects from the plurality of interconnects 425 that are configured to provide ground. It is noted that only part of the electrical path 532 is shown. The electrical path 532 may be coupled to power management integrated circuit (PMIC) through various possible interconnects.

The electrical path 532 may also be configured to be electrically coupled to the passive device 109 and the integrated device 305. The passive device 109 is configured to be electrically coupled to the integrated device 305 through a second plurality of interconnects from the plurality of interconnects 425 of the substrate 402. For example, an electrical path 532 between at least the passive device 109 and the integrated device 305 includes a second plurality of interconnects from the plurality of interconnects 425 of the substrate 402. The electrical path 532 may represent at least part of an electrical path for power between a power management integrated circuit (PMIC) (not shown), the passive device 109 and the integrated device 305. For example, power from a power management integrated circuit (PMIC) may travel through interconnects on a metal layer (e.g., $5^{th}$ metal layer), down towards a bottom metal layer (e.g., $6^{th}$ metal layer) through at least one via interconnect, through a solder interconnect from the plurality of solder interconnects 190 and towards a terminal of the passive device 109, and from the metal layer (e.g., $5^{th}$ metal layer) up towards the metal layer (e.g., $4^{th}$ metal layer) through at least one via interconnect, up towards the metal layer (e.g., $3^{rd}$ metal layer) through at least one core interconnect (e.g., via core interconnect), up towards the metal layer (e.g., $2^{nd}$ metal layer) through at least one via interconnect, up towards the top metal layer (e.g., $1^{st}$ metal layer) through at least one via interconnect and towards the integrated device 305 though at least one solder interconnect from the plurality of solder interconnects 150. In some implementations, another terminal of the passive device 109 may be configured to be electrically coupled to interconnects from the plurality of interconnects 425 that are configured to provide ground. It is noted that only part of the electrical path 532 is shown. The electrical path 532 may be coupled to a power management integrated circuit (PMIC) through various possible interconnects. FIG. 5 illustrates that the electrical path 532 may extend up and down several times through several metal layers and through via interconnects between metal layers, to create additional inductance to help isolate power that is provided to two different integrated devices in a shared power distribution network. In some implementations, the electrical path 532 may extend up and down between two or more neighboring metal layers to create additional inductance to help improve isolation.

The electrical path 532 may include a plurality of interconnects from the plurality of interconnects 425 that are configured as at least one inductor defined by at least one interconnect on one metal layer, another interconnect on another metal layer and at least one via interconnect. The inductor is integrated in the package substrate 402 and is configured to be coupled to power. The inductor may include one or more multiple windings (from interconnects) up and down two or more metal layers of the package substrate 402. The inductor that is defined by at least one via interconnect (e.g., additional via interconnect) may be located along an electrical path that is located between the passive device 107 and the passive device 109. The inductor that is defined by at least one via interconnect (e.g., additional via interconnect) may be located along an electrical path that is located between the integrated device 303 and the integrated device 305. The inductor is located along a common path (e.g., common electrical path) located between the integrated device 303 and the integrated device 305, and located between the passive device 107 and the passive device 109. Thus, the additional windings (e.g., vertical windings and/or horizontal windings) of interconnects that are part of an electrical path between the passive device 107 and the passive device 109 and are part of an electrical path between the integrated device 303 and the integrated device 305, help increase the inductance, which helps reduce noise transfer between integrated devices.

FIG. 5 illustrates an example of what a common path or common electrical path may mean. The electrical path 532 includes a point A, a point B, a point C, a point D, a point AC and a point BD. The point A may represent a pin and/or a terminal for the integrated device 303. The point B may represent a pin and/or a terminal for the integrated device

305. The point C may represent a pin and/or a terminal for the passive device 107. The point D may represent a pin and/or a terminal for the passive device 109. It is noted that the point A, the point B, the point C and/or the point D may represent other components in the electrical path 532. For example, the point A may represent the integrated device 303, the point B may represent the integrated device 305, the point C may represent the passive device 107 and/or the point D may represent the passive device 109.

The point AC is a point located on the electrical path 532 and is located between the point A and the point C. The point BD is a point located on the electrical path 532 and is located between the point B and the point D. In some implementations, the common path for between the point A, the point B, the point C and the point D may be a path located between the point AC and the point BD. In some implementations, the additional inductance that is provided through the electrical path 532 is located in between the point AC and the point BD. Thus, at least some interconnects (e.g., third plurality of interconnects) that are part of the electrical path 532, and that are located between the point AC and the point BD may be configured as an inductor to provide additional inductance, to help reduce noise transfer between integrated devices. The interconnects that are located between AC and the point BD of the electrical path 532 may be a subset of interconnects from interconnects that define the electrical path 532. The point AC may represent one or more interconnects from the electrical path 532. The point BD may represent one or more interconnects from the electrical path 532.

It is noted that the concept and/or definition of a common path and/or a common electrical path may be applicable to a package substrate and/or a board substrate. Moreover, the concept and/or definition of common path and/or a common electrical path may be applicable to any packages and/or configurations shown and described in the disclosure. It is further noted that the electrical path, the common path, and/or the common electrical path are meant to be conceptual representations of paths, and as such, the electrical path, the common path and/or the common electrical path may have different shapes and/or configurations, and/or may extend in different directions in and/or around a substrate (e.g., board substrate, package substrate).

FIGS. 3-5 illustrate how at least one electrical path may be lengthened in the package substrate by extending the electrical paths up and down through several metal layers and between metal layers, which creates additional inductance that helps with isolation between power to different integrated devices in a shared power distribution network. As will be further described below in at least FIG. 10, this design and/or approach of routing power may help improve power delivery, and provide improved isolation (e.g., by adding inductance through interconnects) between power to different integrated devices, and reducing noise transfer between integrated devices.

FIGS. 1-5 illustrate examples of columns of interconnects that are located in a substrate (e.g., board substrate, package substrate). The column of interconnects in a substrate may be used to electrically couple an integrated device to a passive device. The additional inductance that are created by the windings described in the disclosure may be located along an electrical path between two column of interconnects that are each electrically coupled to a respective integrated device and a respective passive device. It is noted that the use of a column of interconnects is not necessary. In some implementations, other types of vertical electrical paths may be used between an integrated device and a capacitor.

Figure 6:
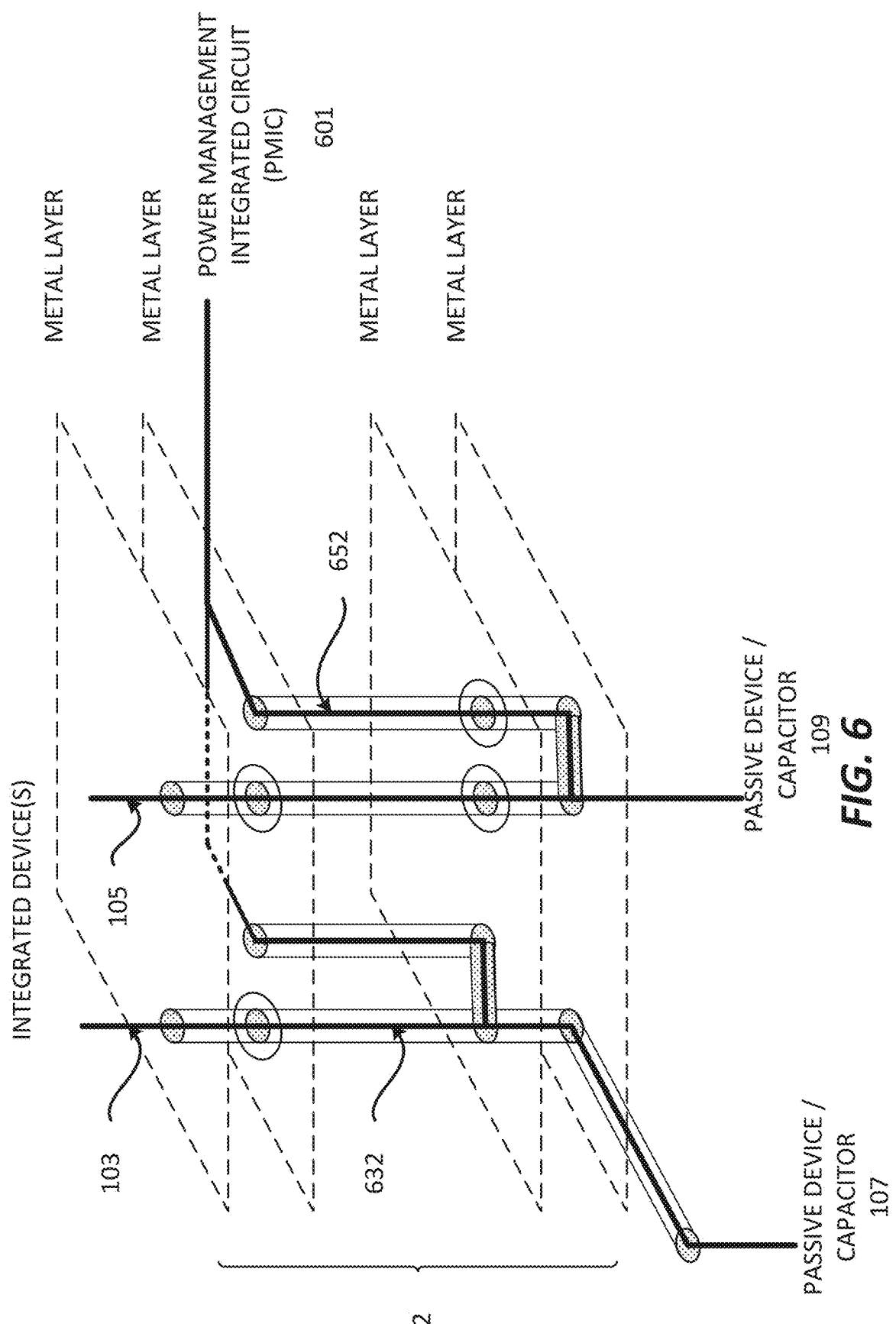
FIG. 6 illustrates exemplary electrical paths in a substrate.

FIG. 6 conceptually illustrates exemplary electrical paths in a substrate. FIG. 6 conceptually illustrates a substrate 602 that includes at least 4 metal layers. For purpose of clarity, only four metal layers are shown. However, the substrate 602 may include more than four metal layers. Each metal layer may include a plurality of interconnects. The substrate 602 may conceptually represent any of the substrates described in the disclosure. The substrate 602 may represent a package substrate or a board substrate (e.g., board, printed circuit board).

It is noted that (i) a first metal layer of a substrate, as used in the disclosure, may mean any of the metal layers of the substrate, (ii) a second metal layer of the substrate, as used in the disclosure, may mean any of the metal layers of the substrate, (iii) a third metal layer of the substrate, as used in the disclosure, may mean any of the metal layers of the substrate, and (iv) a fourth metal layer of the substrate, as used in the disclosure, may mean any of the metal layers of the substrate.

The at least 4 metal layers include a first metal layer, a second metal layer, a third metal layer and a fourth metal layer. In some implementations, the first metal layer may represent a top metal layer of the substrate. In some implementations, the fourth metal layer may represent a bottom metal layer of the substrate. The second metal layer and the third metal layer are located between the first metal layer and the fourth metal layer. The second metal layer is located between the first metal layer and the third metal layer. The third metal layer is located between the second metal layer and the fourth metal layer. In one example, when the substrate 602 includes 7 metal layers, the first metal layer may be a M1 metal layer, the second metal layer may be a M2 metal layer or M3 metal layer, the third metal layer may be a M5 metal layer or a M6 metal layer, and the fourth metal layer may be a M7 metal layer. Thus, the metal layers that are shown in the substrate 602 do not necessarily need to correspond to specific metal layers of a substrate. Rather, the metal layers shown in the substrate 602 may represent positions of metal layers relative to other metal layers in the substrate. Thus, for example, in some implementations, there may be at least one metal layer between the first metal layer and the second metal layer. Similarly, in some implementations, there may be at least one metal layer between the second metal layer and the third metal layer. Moreover, in some implementations, there may be at least one metal layer between the third metal layer and the fourth metal layer. When an electrical path extends from one metal layer to another metal layer, the electrical path may also extend between any metal layers between the two metal layers. For example, if an electrical path extends from a third metal layer and a second metal layer, the electrical path may also extend through any metal layer (e.g., any interconnects) that is/are located between the third metal layer and the second metal layer.

In FIG. 6, a power interconnect (e.g., wide trace interconnect, plane interconnect, rail interconnect) may be located in the second metal layer (e.g., M2 layer). The power interconnect may be configured to be electrically coupled to a power management integrated circuit (PMIC) 601. A power interconnect is a type of interconnect whose size, width and/or shape is greater than a pad interconnect and/or a trace interconnect. A power interconnect may occupy a large part of a metal layer (e.g., 10 percent or more of the metal layer). A power interconnect may have a width that is at least 50 percent greater than the width of a trace inter-connect. The power interconnect is configured to provide an electrical path for power to provide low impedance power. A power interconnect may be split into several smaller individual power trace interconnects. For example, a power interconnect may include a wide power interconnect that may split and become two or more power trace intercon-nects. The width of the power trace interconnects may be less than the width of the wide power interconnect. In some implementations, the width of the power trace interconnects may be similar, the same or greater than a width of trace interconnects configured for input/output signals. In some implementations, a power interconnect may include several power interconnects (e.g., several rails of power intercon-nects).

An electrical path 632 between the power management integrated circuit (PMIC) 601, the integrated device 103 and the passive device 107 includes a first plurality of intercon-nects that extend through the second metal layer, down towards the third metal layer through a via interconnect, along the third metal layer, down towards a fourth metal layer through a via interconnect and towards the passive device 107, up from the third metal layer and towards the second metal layer through a via interconnect, up towards the first metal layer through a via interconnect, and towards the integrated device 103. It should be noted that the part of the electrical path 632 between the second metal layer and the first metal layer does not touch the power interconnect on the second metal layer.

An electrical path 652 between the power management integrated circuit (PMIC) 601, the integrated device 105 and the passive device 109 includes a second plurality of inter-connects that extend through the second metal layer, down towards the third metal layer through a via interconnect, down towards a fourth metal layer through a via intercon-nect, along the fourth metal layer, and towards the passive device 109, up from the fourth metal layer and towards the third metal layer through a via interconnect, up towards the second metal layer through a via interconnect, up towards the first metal layer through a via interconnect, and towards the integrated device 105. It should be noted that the part of the electrical path 652 between the second metal layer and the first metal layer does not touch the power interconnect on the second metal layer.

The electrical path 632 and the electrical path 652 may be configured to be coupled to each other through at least one power interconnect on the second metal layer. The power interconnect may be considered to be part of the electrical path 632 and/or the electrical path 652. The electrical path 632 and the electrical path 652 may be considered to be part of a same electrical path.

Figure 7:
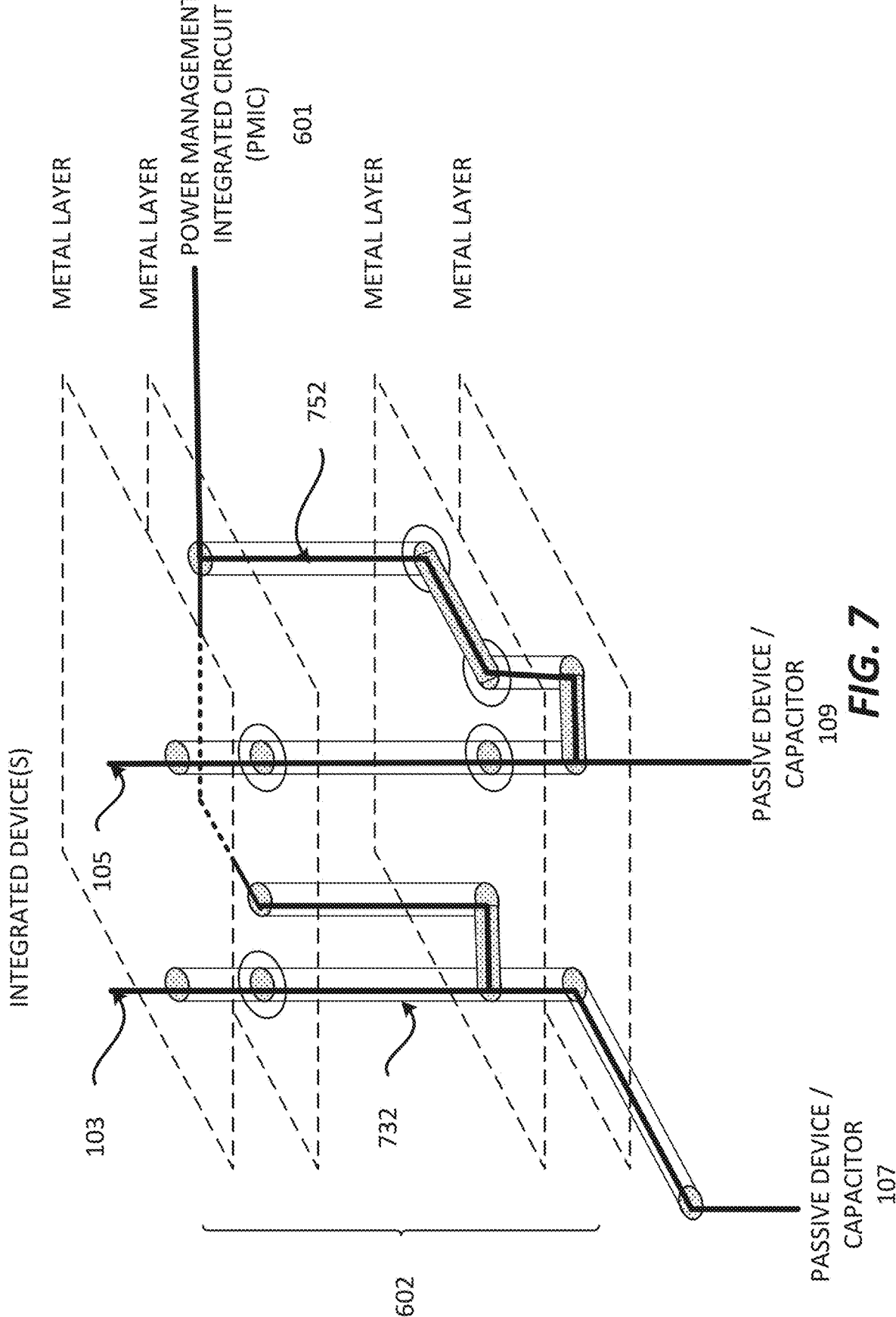
FIG. 7 illustrates exemplary electrical paths in a substrate.

FIG. 7 conceptually illustrates another example of elec-trical paths in the substrate 602. In FIG. 7, a power inter-connect may be located in the second metal layer (e.g., M2 layer). The power interconnect may be configured to be electrically coupled to a power management integrated circuit (PMIC) 601.

An electrical path 732 between the power management integrated circuit (PMIC) 601, the integrated device 103 and the passive device 107 includes a first plurality of intercon-nects that extend through the second metal layer, down towards the third metal layer through a via interconnect, along the third metal layer, down towards a fourth metal layer through a via interconnect and towards the passive device 107, up from the third metal layer and towards the second metal layer through a via interconnect, up towards the first metal layer through a via interconnect, and towards the integrated device 103. It should be noted that the part of the electrical path 732 between the second metal layer and the first metal layer does not touch the power interconnect on the second metal layer.

An electrical path 752 between the power management integrated circuit (PMIC) 601, the integrated device 105 and the passive device 109 includes a second plurality of inter-connects that extend through the second metal layer, down towards the third metal layer through a via interconnect, along the third metal layer, down towards a fourth metal layer through a via interconnect, along the fourth metal layer, and towards the passive device 109, up from the fourth metal layer and towards the third metal layer through a via interconnect, up towards the second metal layer through a via interconnect, up towards the first metal layer through a via interconnect, and towards the integrated device 105. It should be noted that the part of the electrical path 752 between the second metal layer and the first metal layer does not touch the power interconnect on the second metal layer.

The electrical path 732 and the electrical path 752 may be configured to be coupled to each other through at least one power interconnect on the second metal layer. The power interconnect may be considered to be part of the electrical path 732 and/or the electrical path 752. The electrical path 732 and the electrical path 752 may be considered to be part of a same electrical path.

Figure 8:
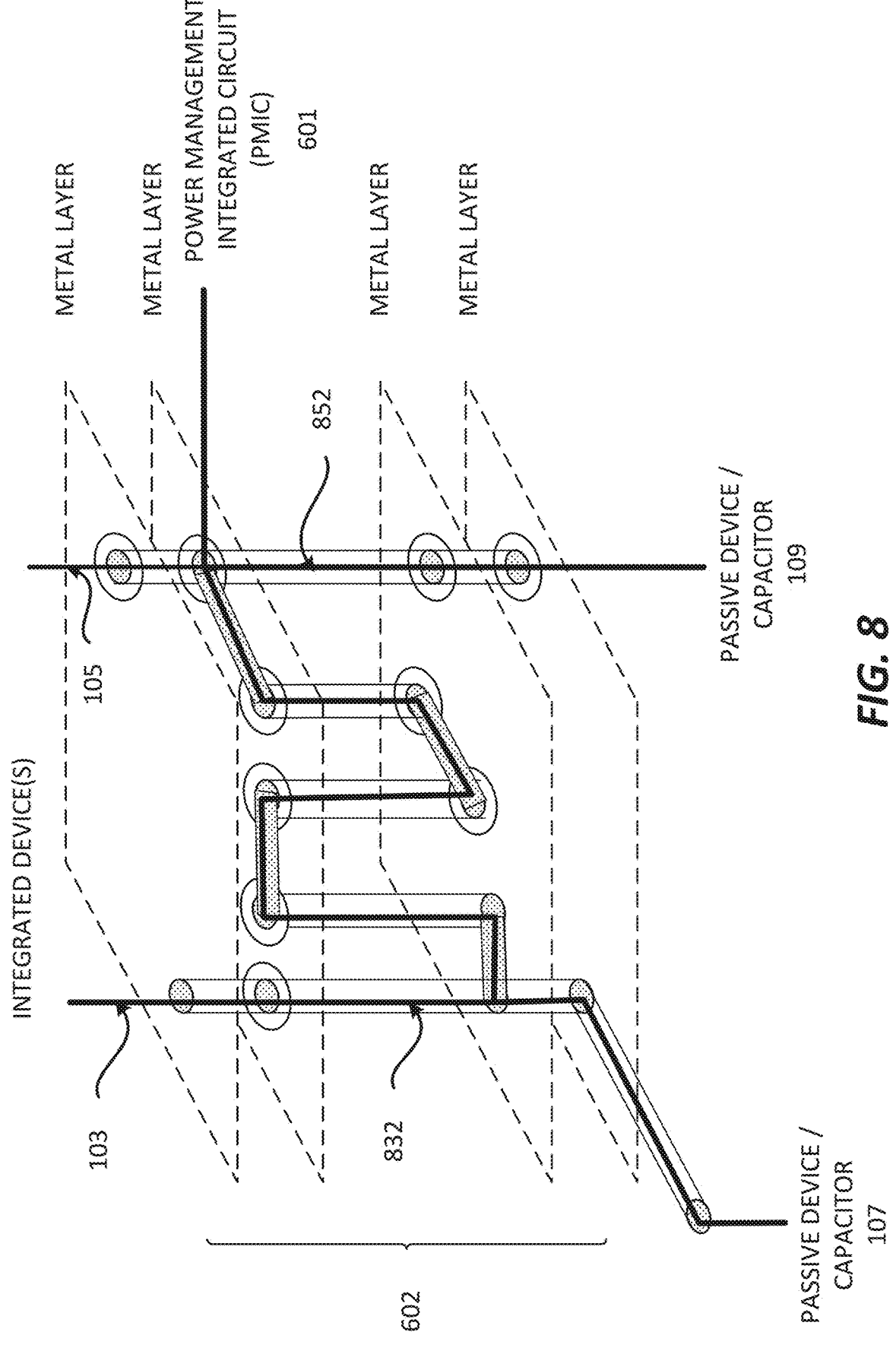
FIG. 8 illustrates exemplary electrical paths in a substrate.

FIG. 8 conceptually illustrates another example of elec-trical paths in the substrate 602. In FIG. 8, a power inter-connect may be located in the second metal layer (e.g., M2 layer). The power interconnect may be configured to be electrically coupled to a power management integrated circuit (PMIC) 601.

An electrical path 832 between the power management integrated circuit (PMIC) 601, the integrated device 103 and the passive device 107 includes a first plurality of intercon-nects that extend through the second metal layer, down towards the third metal layer through a via interconnect, along the third metal layer, up towards the second metal layer through a via interconnect, along the second metal layer, down towards the third metal layer through a via interconnect, along the third metal layer, down towards a fourth metal layer through a via interconnect, along the fourth metal layer and towards the passive device 107, up from the third metal layer and towards the second metal layer through a via interconnect, up towards the first metal layer through a via interconnect, and towards the integrated device 103. It should be noted that the part of the electrical path 832 between the second metal layer and the first metal layer does not touch the power interconnect on the second metal layer.

An electrical path 852 between the power management integrated circuit (PMIC) 601, the integrated device 105 and the passive device 109 includes a second plurality of inter-connects that extend through the second metal layer, down towards the third metal layer through a via interconnect, down towards a fourth metal layer through a via intercon-nect, and towards the passive device 109, and up from the second metal layer and towards the first metal layer through a via interconnect, and towards the integrated device 105.

The electrical path 832 and the electrical path 852 may be configured to be coupled to each other through at least one interconnect (e.g., a power interconnect) on the second metal layer. The power interconnect may be considered to be part of the electrical path 832 and/or the electrical path 852. The electrical path 832 and the electrical path 852 may be considered to be part of a same electrical path.

In some implementations, a power interconnect that is configured to be electrically coupled to a power management integrated circuit (PMIC) may be located on a different metal layer than what is shown and described in at least FIGS. 6-8.

Figure 9:
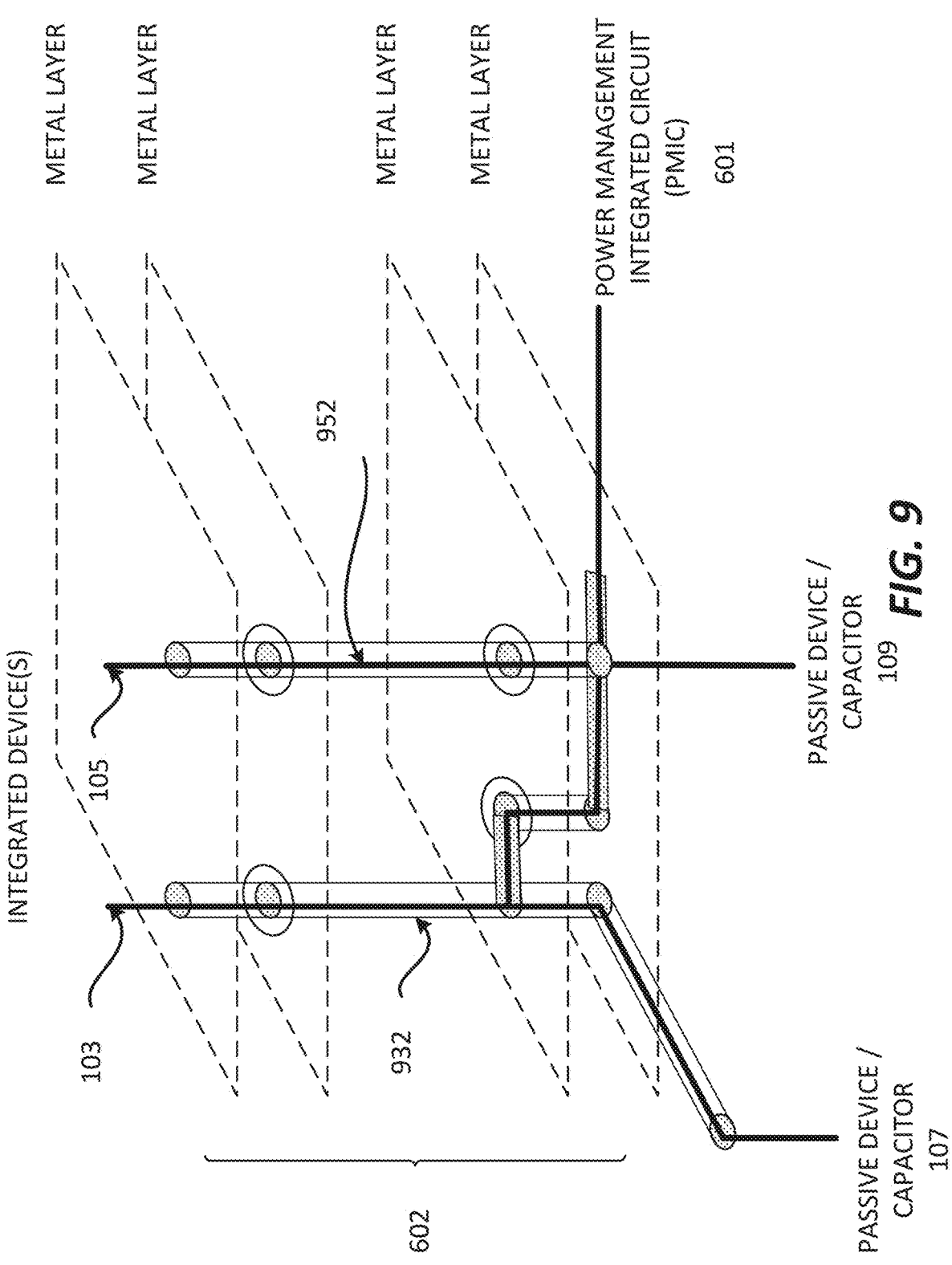
FIG. 9 illustrates exemplary electrical paths in a substrate.

FIG. 9 conceptually illustrates another example of electrical paths in the substrate 602. In FIG. 9, a power interconnect may be located in the fourth metal layer (e.g., M4 layer). The power interconnect may be configured to be electrically coupled to a power management integrated circuit (PMIC) 601.

An electrical path 932 between the power management integrated circuit (PMIC) 601, the integrated device 103 and the passive device 107 includes a first plurality of interconnects that extend through the fourth metal layer, up towards the third metal layer through a via interconnect, along the third metal layer, down towards the fourth metal layer through a via interconnect, along the fourth metal layer, along the fourth metal layer, and towards the passive device 107, up from the third metal layer and towards the second metal layer through a via interconnect, up towards the first metal layer through a via interconnect, and towards the integrated device 103. It should be noted that the part of the electrical path 932 between the fourth metal layer and the third metal layer may not touch the power interconnect on the fourth metal layer.

An electrical path 952 between the power management integrated circuit (PMIC) 601, the integrated device 105 and the passive device 109 includes a second plurality of interconnects that extend through the fourth metal layer, down towards the passive device 109, and up from the fourth metal layer and towards the third metal layer through a via interconnect, up towards the second metal layer through a via interconnect, up towards a first metal layer, and towards the integrated device 105.

The electrical path 932 and the electrical path 952 may be configured to be coupled to each other through at least one interconnect (e.g., a power interconnect) on the second metal layer. The power interconnect may be considered to be part of the electrical path 932 and/or the electrical path 952. The electrical path 932 and the electrical path 952 may be considered to be part of a same electrical path.

In some implementations, an electrical path for power may include and/or extend through at least one ferrite bead (e.g., ferrite bead device). The ferrite head may be coupled to a board substrate and/or a package substrate. The ferrite bead (e.g., ferrite bead device) may be a discrete component that is coupled to the board substrate and/or the package substrate through a plurality of solder interconnects. The ferrite beads may help increase the inductance. The one or more ferrite beads may be coupled to a first surface of a substrate and/or a second surface substrate. The one or more ferrite beads may be embedded in a substrate.

Figure 10:
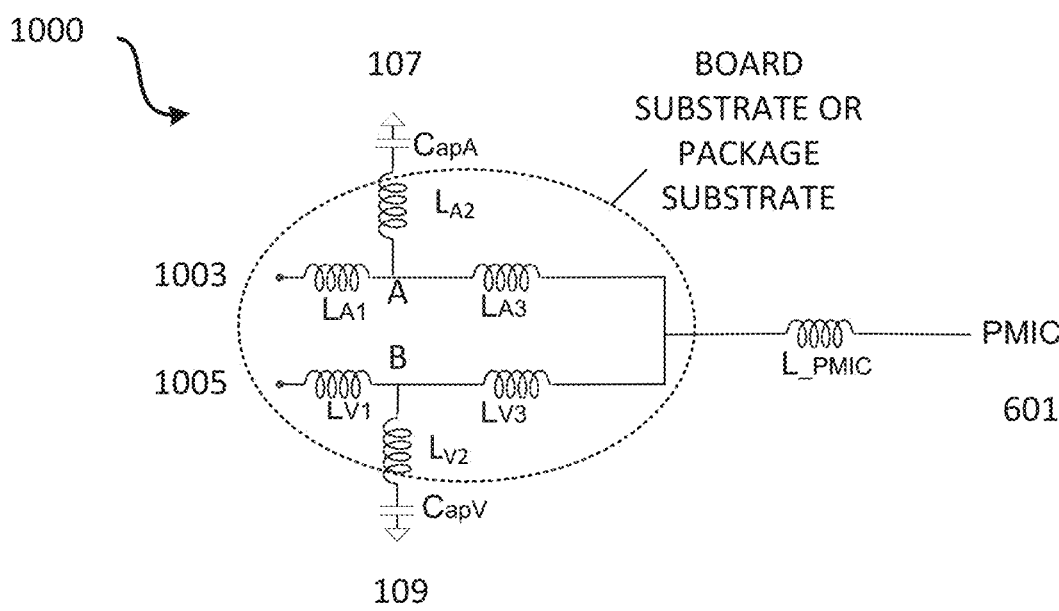
FIG. 10 illustrates exemplary electrical circuit diagrams for a board substrate and/or a package that includes a package substrate and integrated devices with shared power distribution network.
Figure 10:
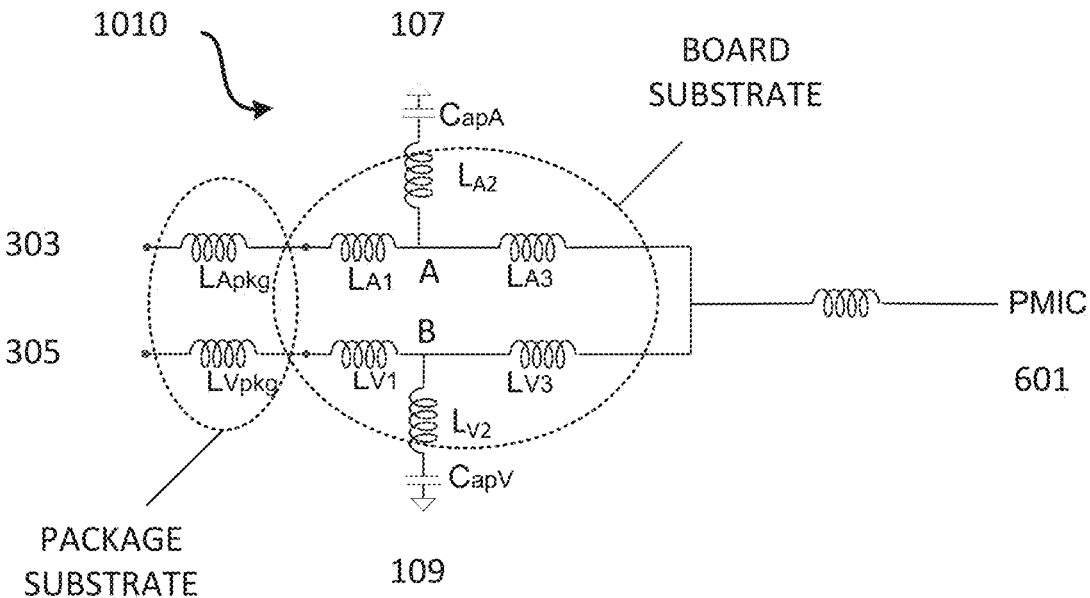

FIG. 10 illustrates a circuit diagram 1000 and a circuit diagram 1010. The circuit diagram 1000 includes the integrated device 1003, the integrated device 1005, the passive device 107, the passive device 109 and the power management integrated circuit (PMIC) 601 that are coupled to a board substrate (e.g., 102, 202) or a package substrate (e.g., 302, 402). The integrated device 1003 may represent the integrated device 103 or the integrated device 303. The integrated device 1005 may represent the integrated device 105 or the integrated device 305.

The circuit diagram 1000 includes various inductance between the various components. Using a power interconnect helps provide a low impedance path for power but can result in low quality noise isolation between shared power for the integrated device 1003 and the integrated device 1005. That is, one integrated device's (e.g., 1003) effect on the power may affect the power quality at another integrated device (e.g., 1005), and vice versa. To increase noise isolation between power to one integrated device and power to another integrated device, the isolation inductance at LA3 and LV3 of the circuit diagram 1000 can be increased. Extending the length of the electrical path through various metal layers (e.g., extending up and down, one or more times) may increase the inductance of the electrical path. This approach may improve power isolation and reduce overall power delivery noise from aggressors on shared power nets (e.g., shared interconnects for power), by providing improved isolation (e.g., by adding inductance through interconnects) between power to different integrated devices, and reducing noise transfer between integrated devices.

In the circuit diagram 1000, the integrated device 1003 is the aggressor, meaning that the noise generated in the integrated device 1003 due to the integrated device 1003's activity, such as turning on and off, or signal toggling in an active mode, affects the power that is provided to the integrated device 1005 through the power interconnects. However, in some implementations, the integrated device 1005 may be the aggressor, meaning that the noise generated in the integrated device 1005 due to the integrated device 1005's activity, such as turning on and off, or signal toggling in an active mode, affects the power that is provided to the integrated device 1003 through the power interconnects. Adding more inductance in the circuit of the circuit diagram 1000 (for example increasing the inductance LA3 and/or the inductance LV3) may help isolate the integrated device 1003 and the integrated device 1005 so that the integrated device 1003 does not affect the integrated device 1005 due to the activity of integrated device 1003, and vice versa.

The circuit diagram 1010 includes the integrated device 303, the integrated device 305, the passive device 107 and the passive device 109 that are coupled to a package substrate (e.g., 302, 402) and a board substrate (e.g., 102, 202). The circuit diagram 1010 includes various inductance between the various components. Using a power interconnect helps provide a low impedance path for power but can result in low quality noise isolation between shared power for the integrated device 303 and the integrated device 305. That is, one integrated device's (e.g., 303) effect on the power may affect the power quality at another integrated device (e.g., 305), and vice versa. To increase noise isolation between power to one integrated device and power to another integrated device, the isolation inductance at LA3 and LV3 of the circuit diagram 1010 can be increased. Extending the length of the electrical path through various metal layers (e.g., extending up and down, one or more times) may increase the inductance of the electrical path. This approach may improve power isolation and reduce overall power delivery noise from aggressors on shared power nets, by providing improved isolation (e.g., by adding inductance through interconnects) between power to different integrated devices, and reducing noise transfer between integrated devices.

In the circuit diagram 1010, the integrated device 303 is the aggressor, meaning that the noise generated in the integrated device 303 due to the integrated device 303's activity, such as turning on and off, or signal toggling in an active mode, affects the power that is provided to the integrated device 305 through the power interconnects. However, in some implementations, the integrated device 305 may be the aggressor, meaning that the noise generated in the integrated device 305 due to the integrated device 305's activity, such as turning on and off, or signal toggling in an active mode, affects the power that is provided to the integrated device 303 through the power interconnects. Adding more inductance in the circuit of the circuit diagram 1010 (for example increasing the inductance LA3 and/or the inductance LV3) may help isolate the integrated device 303 and the integrated device 305 so that the integrated device 303 does not affect the integrated device 305 due to the activity of the integrated device 303, and vice versa.

In some implementations, the points A and B may conceptually represent the connection points of the added inductance in the electrical path. In some implementations, an electrical path between points A and B may conceptually represent added interconnects that include via interconnects, that are configured to provide inductance and/or additional inductance in the electrical path. The added interconnects (e.g., via interconnects) help provide isolation. The point B may conceptually represent a connection to a lead, a pin (e.g., cap pin) and/or a terminal of the passive device 109, where the point B is touching the lead, the pin and/or the terminal of the passive device 109, which is why the inductance LV2=0. The point A may conceptually represent a coupling to the passive device 107. However, the point A is not in direct contact with a lead, a pin and/or a terminal of the passive device 107. It is noted that point A and point B may be located in any metal layers. The added path between point A and point B increases the path length from the integrated device (e.g., 303, 1003) and the integrated device (e.g., 305, 1005) in order to increase the isolation between the two integrated devices.

It is noted that a plurality of solder interconnects (e.g., ball grid array) may be used for one integrated device. It is also noted that several capacitors (e.g., multiple decaps) may be used for one integrated device. For example, the CapA in FIG. 10 could represent multiple decaps in parallel. Moreover, the CapV in FIG. 10 could represent multiple decoupling capacitors in parallel.

It is noted that the CapA and the CapV in FIG. 10 could each have inductance and resistance, but are not shown in the figure. For purpose of simplification, we assume the CapA and the CapV are lumped elements, with ideal capacitance, but in the real world there are inductance (for example, lead inductance) and/or resistance in a capacitor.

The integrated device (e.g., 303, 1003) may represent multiple devices. One or more integrated devices may share the CapA. The integrated device (e.g., 305, 1005) may represent several integrated devices. One or more integrated devices may share the CapV.

It is noted that the capacitors may be coupled to the substrate (e.g., board substrate, package substrate) in many different ways. For example, the capacitors may be coupled to a bottom surface of a substrate. Such capacitors may be referred as land side capacitors. In some implementations, one or more capacitors may be coupled to a top surface of a substrate. Such capacitors may be referred as die side capacitors. In some implementations, one or more capacitors may be coupled to a substrate such that a capacitor is embedded and/or located in the substrate. Such capacitors may be referred as embedded capacitors. In some implementations, combinations of land side capacitors, die side capacitors and/or embedded capacitors may be used. Examples of different arrangements and/or configurations of capacitors are further illustrated and described below in at least FIGS. 17-19.

As mentioned above, at least one ferrite bead (e.g., ferrite bead device) may be used in combination with the added inductance through interconnects. The ferrite bead may be coupled to a board substrate and/or a package substrate. The ferrite bead (e.g., ferrite bead device) may be a discrete component that is coupled to the board substrate and/or the package substrate through a plurality of solder interconnects. The one or more ferrite beads may be coupled to a first surface of a substrate and/or a second surface substrate. The one or more ferrite beads may be embedded in a substrate. The ferrite beads may help increase isolation inductance between integrated devices.

Figure 11:
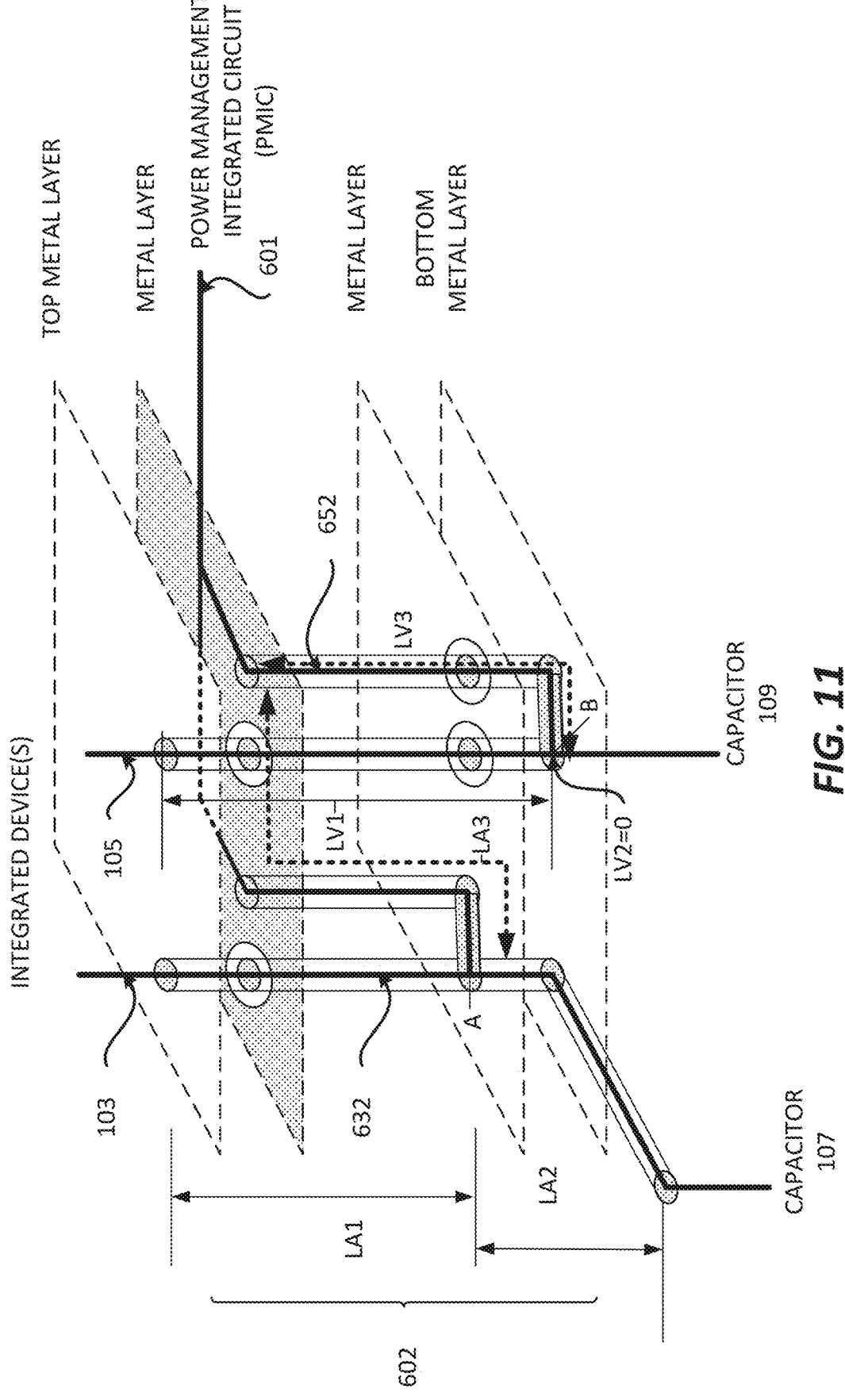
FIG. 11 illustrates exemplary electrical paths in a substrate.

FIG. 11 illustrates how the circuit diagram 1000 in FIG. 10 may correspond to the substrate 602, the integrated device 103, the integrated device 105, the passive device 107, and the passive device 109. For example. FIG. 11 illustrates how LA3 and LV3 may be measured, and/or how LA1 may be measured. The points A and B of FIG. 11 may correspond to the points A and B of the circuit diagram 1000. The circuit diagram 1000 may be applicable to other configurations of the substrate, the integrated devices and the passive devices shown and described in the disclosure. The use of the additional via interconnects, additional pad interconnects and/or additional trace interconnects in the electrical path helps create a more inductive path, which helps provide improved isolation, without having to add and/or couple discrete inductors to the substrate (e.g., board substrate, package substrate), which helps reduce the overall cost of the package. In some implementations, an isolation (L) of 100 pH to 1.5 nH and/or more may be achieved by adding and/or providing additional via interconnects, additional pad interconnects and/or additional trace interconnects.

It is noted that the implementation of additional via interconnects, pad interconnects and/or trace interconnects to extend the length of an electrical path is not limited to any particular substrate. In some implementations, additional via interconnects, additional pad interconnects and/or additional trace interconnects that are described in FIGS. 1-9 and 11 may be implemented in a package substrate and/or a board substrate (e.g., board, printed circuit board). Thus, a concept that is described for a package substrate may also be implemented in a board substrate. Similarly, a concept that is described for a board substrate may also be implemented in a package substrate.

Figure 12:
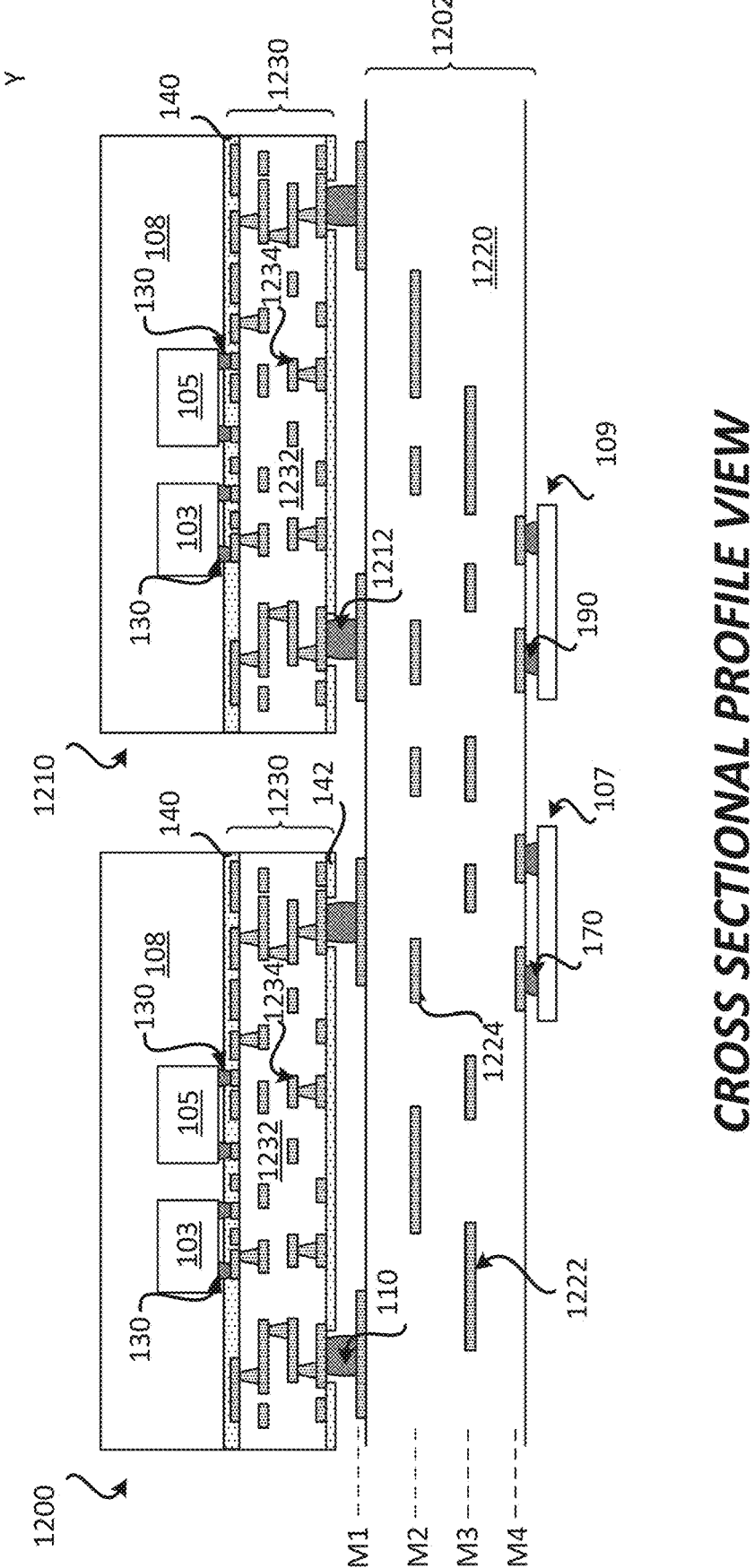
FIG. 12 illustrates a profile cross sectional view of an exemplary package coupled to a board substrate, where the package includes a package substrate and integrated devices.

FIG. 12 illustrates a package 1200 and a package 1210 coupled to a board 1202 (e.g., board substrate). In this example, at least two packages share a power supply. The package 1200 includes the package substrate 1230, the integrated device 103, the integrated device 105 and the encapsulation layer 108. Similarly, the package 1210 includes the package substrate 1230, the integrated device 103, the integrated device 105 and the encapsulation layer 108. The package substrate 1230 includes at least one dielectric layer 1232 and a plurality of interconnects 1234.

The package 1200 is coupled to a first surface (e.g., top surface) of the board 1202 through the plurality of solder interconnects 110. The package 1210 is coupled to a first surface (e.g., top surface) of the board 1202 through the plurality of solder interconnects 1212. The board 1202 includes at least one board dielectric layer 1220 and a plurality of board interconnects 1222. The passive device 107 is coupled to a second surface (e.g., bottom surface) of the board 1202 through the plurality of solder interconnects 170. The passive device 109 is coupled to a second surface (e.g., bottom surface) of the board 1202 through the plurality of solder interconnects 190. Any of the electrical paths described above for FIGS. 1-9 and 11 may be implemented in the package substrate 1230 and/the board 1202 (e.g., board substrate).

FIGS. 1-9 and 11-12 illustrate two separate integrated devices that share a power distribution network. However, in some implementations, a single integrated device with two or more processing cores may each have their own power requirements. In such instances, the processing cores of the single integrated device may share a power distribution network. The designs and/or the configurations of a shared power distribution network and its accompanying electrical paths shown in the disclosure may be applicable to a single integrated device with multiple processing cores, each having its owns power requirement. Thus, in the examples described above, a first electrical path may be configured to be coupled to a first processing core of the integrated device 103, and a second electrical path may be configured to a second processing core of the integrated device 103. Moreover, the designs and/or the configurations of a shared power distribution network may be applicable to more than two integrated devices. For example, some implementations may include a third integrated device and a third passive device that share a power distribution network with the first integrated device, the second integrated device, the first passive device and the second passive device. It is noted that various implementations may use any combinations of the configurations and/or designs described in the disclosure.

The above configurations are not limited to just two integrated devices. In some implementations, the above configurations may be implemented with more than two integrated devices and more than two passive devices that are coupled to the board substrate and/or coupled to a package substrate. Additionally, more than two integrated devices could share one power supply. The concept of added inductance as described in the disclosure may be applicable to other integrated devices that share a power supply with at least one integrated device.

Exemplary Sequence for Fabricating a Substrate

Figure 13A:
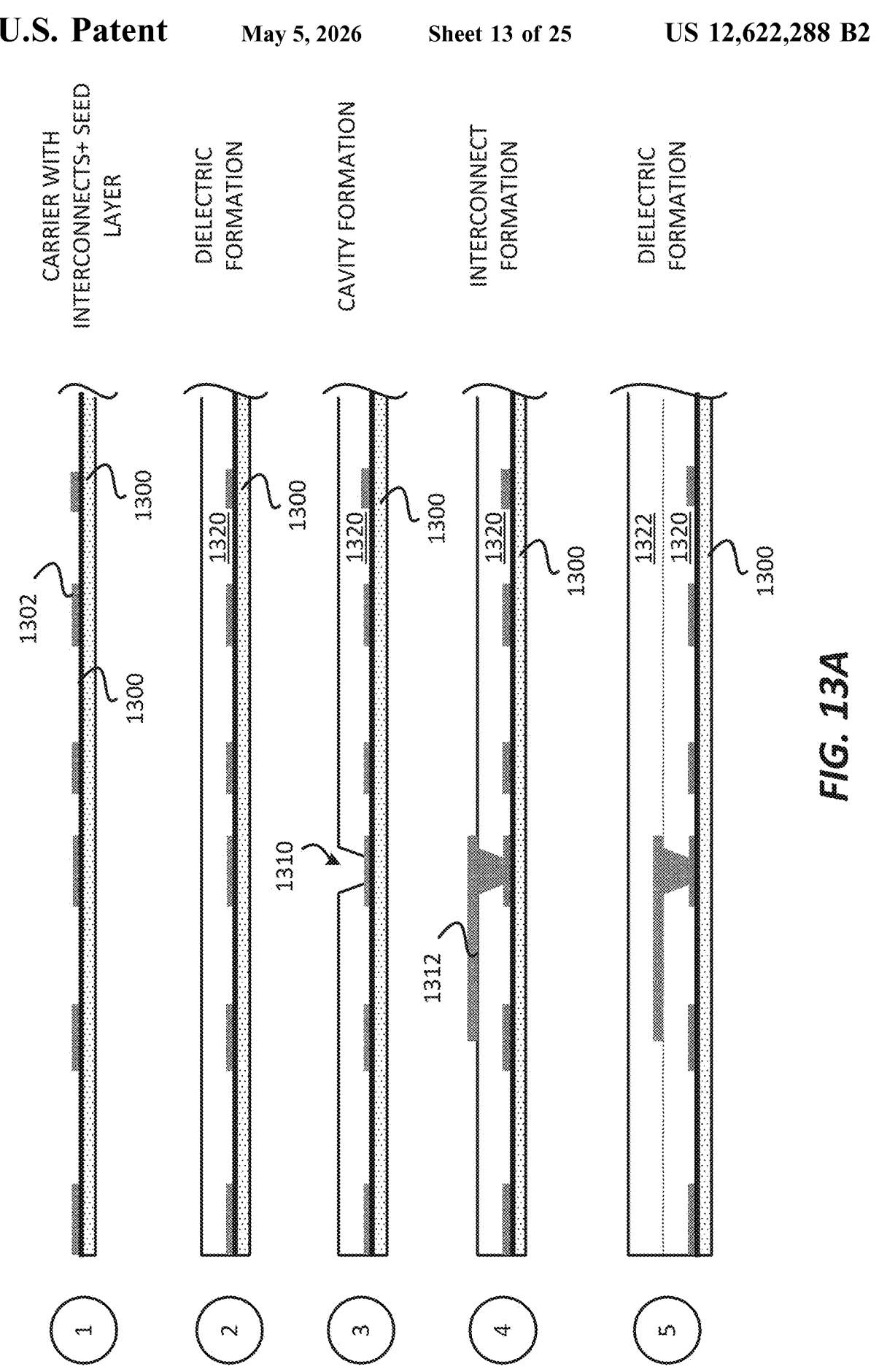
FIGS. 13A-13C illustrate an exemplary sequence for fabricating a substrate with interconnects.
Figure 13B:
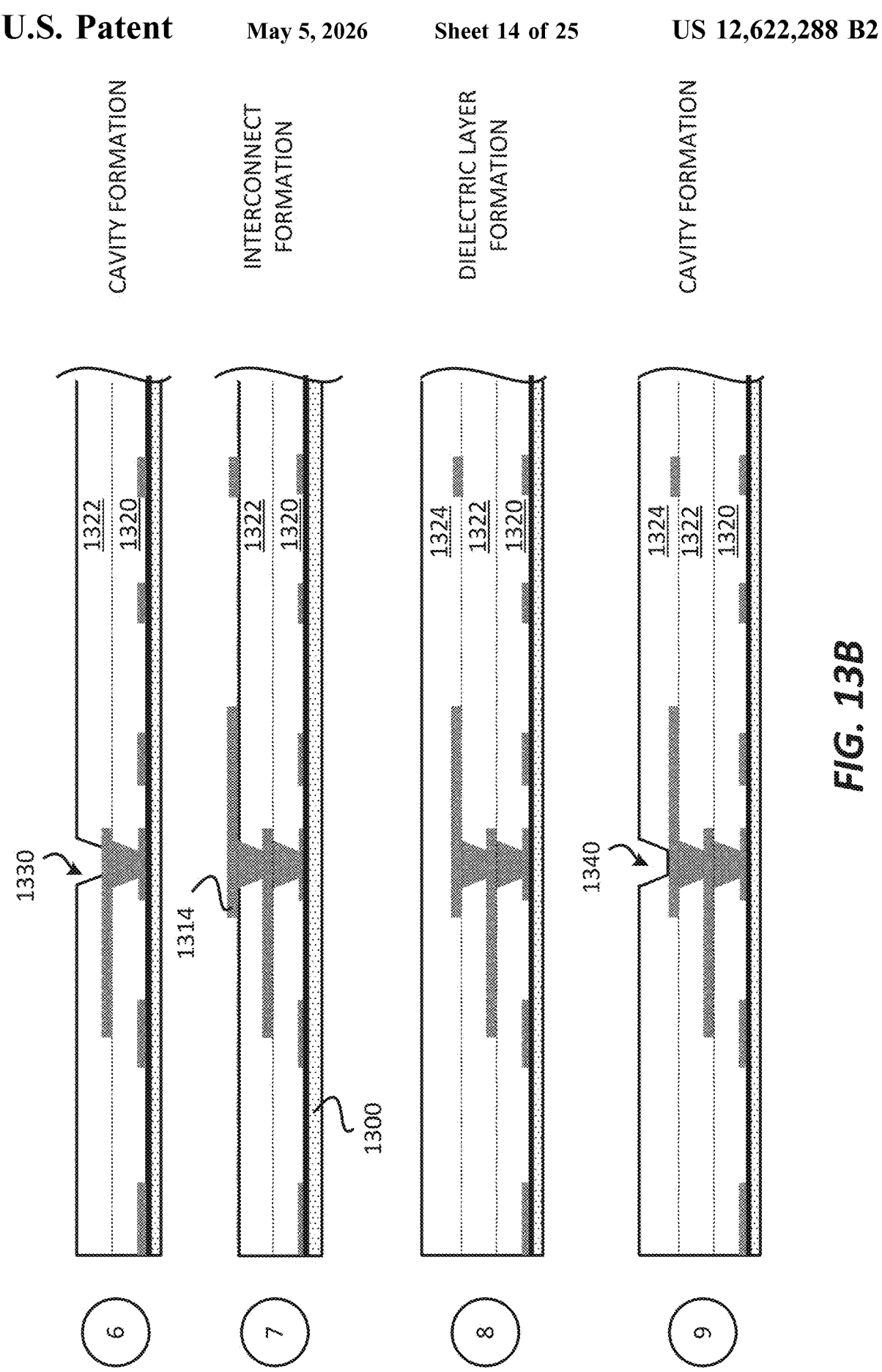
Figure 13C:
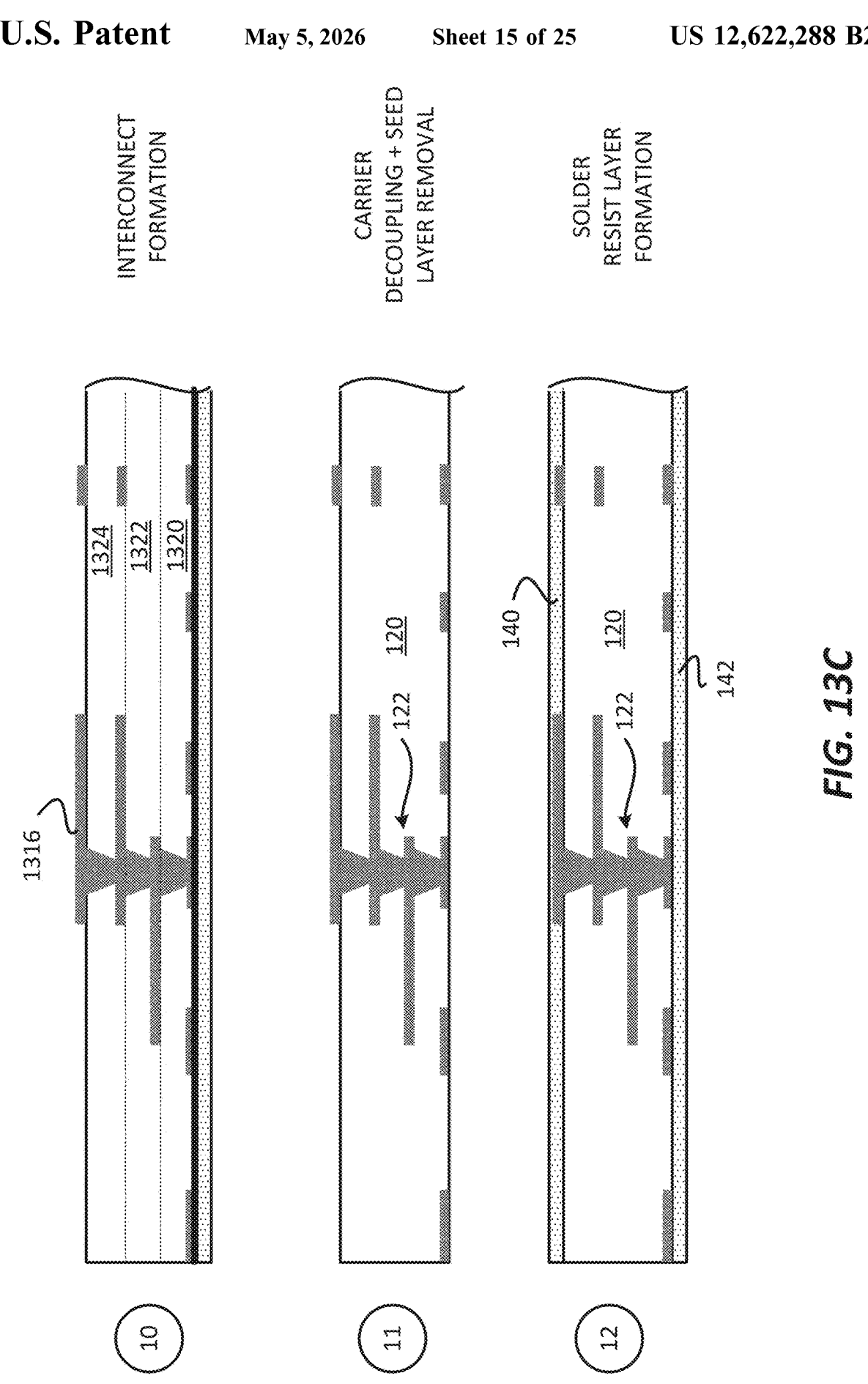

In some implementations, fabricating a substrate includes several processes. FIGS. 13A-13C illustrate an exemplary sequence for providing or fabricating a substrate (e.g., package substrate). In some implementations, the sequence of FIGS. 13A-13C may be used to provide or fabricate a substrate. However, the process of FIGS. 13A-13C may be used to fabricate any of the substrates described in the disclosure. In some implementations, the process of FIGS. 13A-13C or a modification of FIGS. 13A-13C may be used and/or modified to fabricate a board substrate 102 (e.g., board, printed circuit board).

It should be noted that the sequence of FIGS. 13A-13C may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 13A, illustrates a state after a carrier 1300 is provided. A seed layer 1301 and interconnects 1302 may be located over the carrier 1300. The interconnects 1302 may be located over the seed layer 1301. A plating process and etching process may be used to form the interconnects 1302. In some implementations, the carrier 1300 may be provided with the seed layer 1301 and a metal layer that is patterned to form the interconnects 1302. The interconnects 1302 may represent at least some of the interconnects from the plurality of interconnects 122.

Stage 2 illustrates a state after a dielectric layer 1320 is formed over the carrier 1300, the seed layer 1301 and the interconnects 1302. A deposition and/or lamination process may be used to form the dielectric layer 1320. The dielectric layer 1320 may include prepreg and/or polyimide. The dielectric layer 1320 may include a photo-imageable dielectric. However, different implementations may use different materials for the dielectric layer.

Stage 3 illustrates a state after a plurality of cavities 1310 is formed in the dielectric layer 1320. The plurality of cavities 1310 may be formed using a photolithography process or laser process.

Stage 4 illustrates a state after interconnects 1312 are formed in and over the dielectric layer 1320, including in and over the plurality of cavities 1310. For example, a via, pad and/or traces may be formed. A plating process may be used to form the interconnects.

Stage 5 illustrates a state after a dielectric layer 1322 is formed over the dielectric layer 1320 and the interconnects 1312. A deposition and/or lamination process may be used to form the dielectric layer 1322. The dielectric layer 1322 may include prepreg and/or polyimide. The dielectric layer 1322 may include a photo-imageable dielectric. However, different implementations may use different materials for the dielectric layer.

Stage 6, as shown in FIG. 13B, illustrates a state after a plurality of cavities 1330 is formed in the dielectric layer 1322. The plurality of cavities 1330 may be formed using a photolithography process or laser process.

Stage 7 illustrates a state after interconnects 1314 are formed in and over the dielectric layer 1322, including in and over the plurality of cavities 1330. For example, a via, pad and/or traces may be formed. A plating process may be used to form the interconnects.

Stage 8 illustrates a state after a dielectric layer 1324 is formed over the dielectric layer 1322 and the interconnects 1312. A deposition and/or lamination process may be used to form the dielectric layer 1324. The dielectric layer 1324 may include prepreg and/or polyimide. The dielectric layer 1324 may include a photo-imageable dielectric. However, different implementations may use different materials for the dielectric layer.

Stage 9 illustrates a state after a plurality of cavities 1340 is formed in the dielectric layer 1324. The plurality of cavities 1340 may be formed using a photolithography process (e.g., exposure and development) or laser process.

Stage 10, as shown in FIG. 13C, illustrates a state after interconnects 1316 are formed in and over the dielectric layer 1324, including in and over the plurality of cavities 1340. For example, a via, pad and/or traces may be formed. A plating process may be used to form the interconnects.

Stage 11 illustrates a state after the carrier 1300 is decoupled (e.g., detached, removed, grinded out) from at least one dielectric layer 1320 and the seed layer 1301, portions of the seed layer 1301 are removed (e.g., etched out), leaving the substrate 402 that includes at least one dielectric layer 120 and the plurality of interconnects 122. The at least one dielectric layer 120 may represent the dielectric layer 1320, the dielectric layer 1322 and/or the dielectric layer 1324. The plurality of interconnects 122 may represent the interconnects 1302, 1312, 1314 and/or 1316.

Stage 12 illustrates a state after a solder resist layer 140 and a solder resist layer 142 are formed. A lamination process and/or a deposition process may be used to form the solder resist layer 140 and the solder resist layer 142.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Sequence for Fabricating a Substrate

Figure 14A:
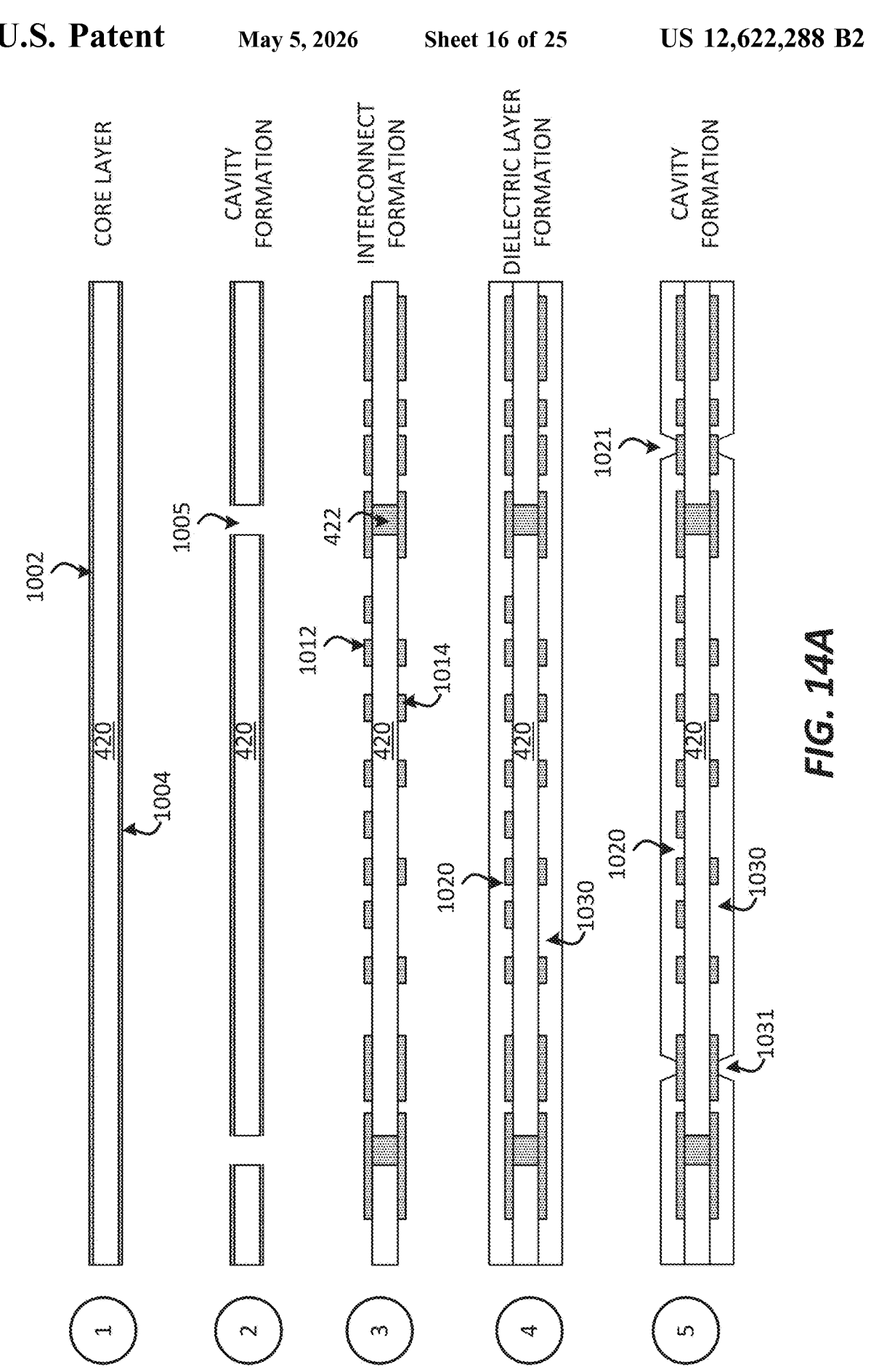
Figure 14B:
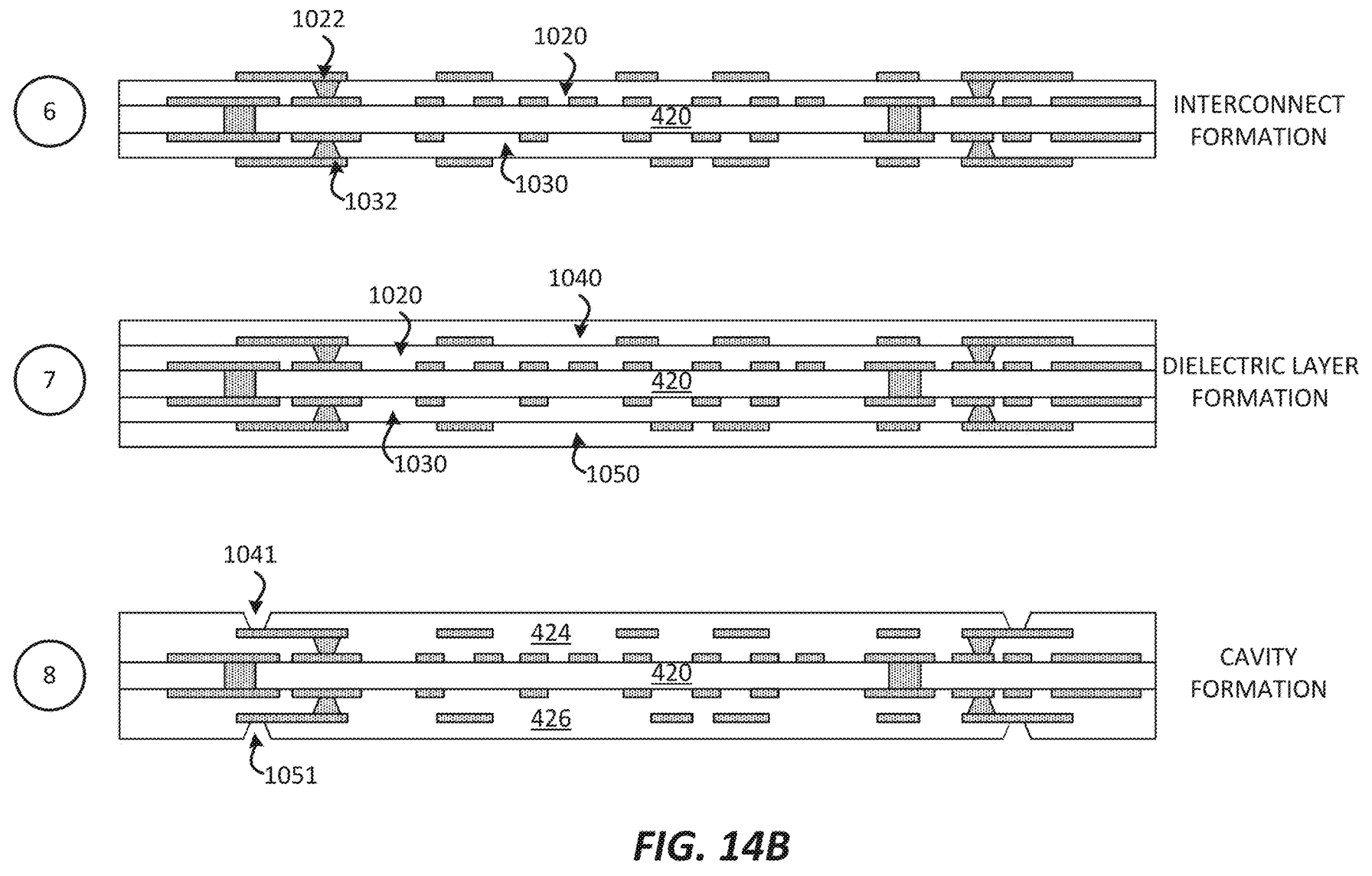
Figure 14C:
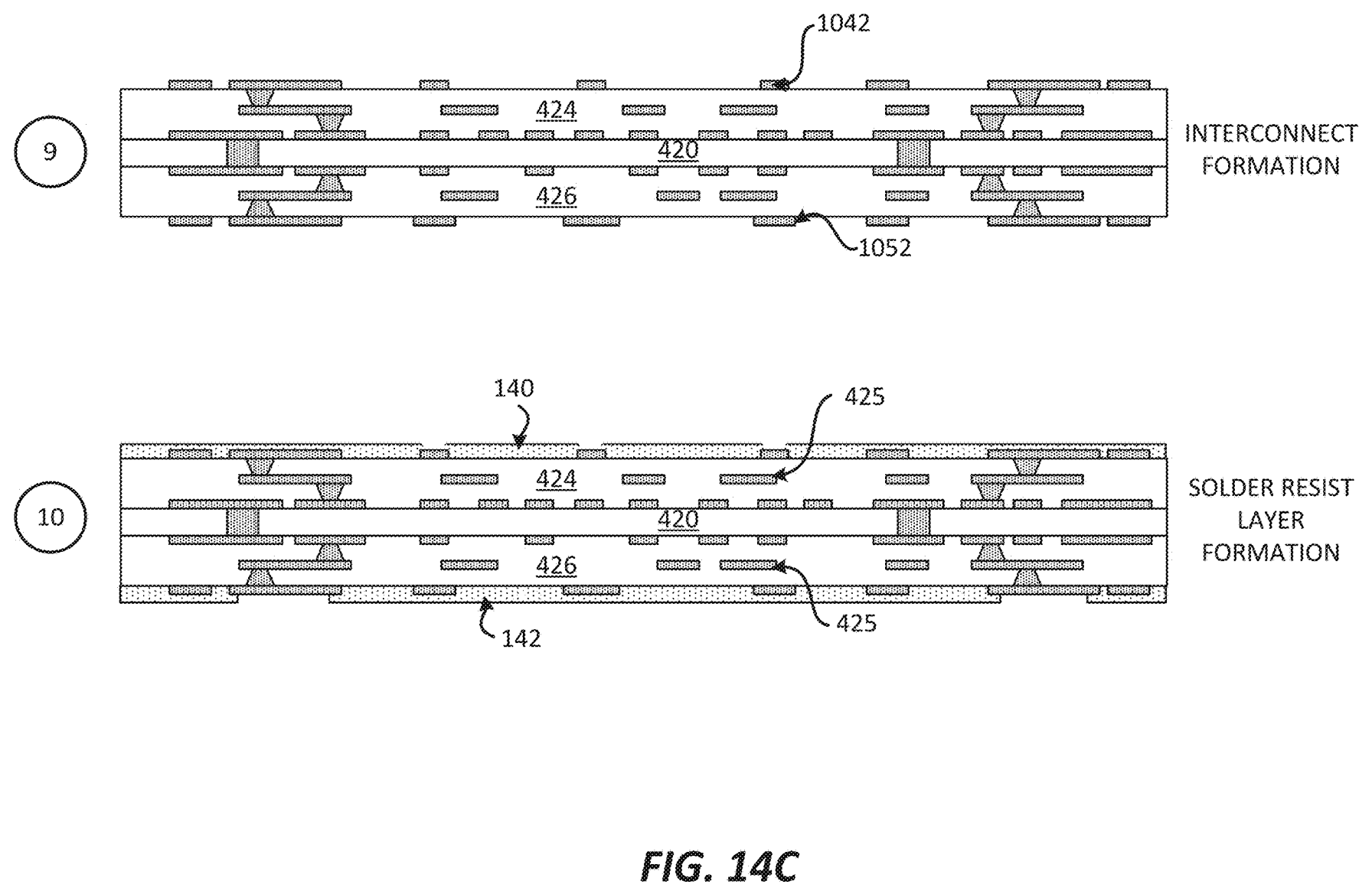

In some implementations, fabricating a substrate includes several processes. FIGS. 14A-14C illustrate an exemplary sequence for providing or fabricating a substrate. In some implementations, the sequence of FIGS. 14A-14C may be used to provide or fabricate the substrate 402. However, the process of FIGS. 14A-14C may be used to fabricate any of the substrates described in the disclosure.

It should be noted that the sequence of FIGS. 14A-14C may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 14A, illustrates a state after a core layer 420 is provided. The core layer 420 may include a seed layer 1402 located on a first surface of the core layer 420 and a seed layer 1404 located on a second surface of the core layer 420. The core layer 420 may be a dielectric.

Stage 2 illustrates a state after a plurality of cavities 1405 are formed through the core layer 420, the seed layer 1402 and the seed layer 1404. The plurality of cavities 1405 may be formed using a photolithography process and/or laser process.

Stage 3 illustrates a state after interconnects are formed in and over surfaces of the core layer 420. A plurality of core interconnects 422 may be formed in the plurality of cavities 1405. A plurality of interconnects 1412 may be formed over (e.g., above) a first surface of the core layer 420. The seed layer 1402 may be part of the plurality of interconnects 1412. A plurality of interconnects 1414 may be formed over (e.g., below) a second surface of the core layer 420. The seed layer 1404 may be part of the plurality of interconnects 1414. A masking, a plating and/or an etching process may be used to form the plurality of core interconnects 422, the plurality of interconnects 1412 and/or the plurality of interconnects 1414.

Stage 4 illustrates a state after a dielectric layer 1420 is formed over (e.g., above) the first surface of the core layer 420 and the plurality of interconnects 1412. Stage 4 also illustrates a state after a dielectric layer 1430 is formed over (e.g., below) the second surface of the core layer 420 and the plurality of interconnects 1414. A deposition and/or a lamination process may be used to form the dielectric layer 1420 and the dielectric layer 1430. The dielectric layer 1420 and the dielectric layer 1430 may be a different material than the core layer 420.

Stage 5 illustrates a state after a plurality of cavities 1421 are formed in the dielectric layer 1420 and a plurality of cavities 1431 are formed in the dielectric layer 1430. The plurality of cavities 1421 and the plurality of cavities 1431 may be formed using a lithography process. A masking, an exposure and/or a development process may be used to form the plurality of cavities 1421 and the plurality of cavities 1431.

Stage 6, as shown in FIG. 14B, illustrates a state after interconnects are formed in and over surfaces of the dielectric layer 1420 and the dielectric layer 1430. A plurality of interconnects 1422 may be formed over (e.g., above) a first surface of the dielectric layer 1420 and the plurality of cavities 1421. A plurality of interconnects 1432 may be formed over (e.g., below) a second surface of the dielectric layer 1430 and the plurality of cavities 1431. A masking, a plating and/or an etching process may be used to form the plurality of interconnects 1422 and/or the plurality of interconnects 1432.

Stage 7 illustrates a state after a dielectric layer 1440 is formed over (e.g., above) the first surface of the dielectric layer 1420 and the plurality of interconnects 1422. Stage 7 also illustrates a state after a dielectric layer 1450 is formed over (e.g., below) the second surface of the dielectric layer 1430 and the plurality of interconnects 1432. A deposition and/or a lamination process may be used to form the dielectric layer 1440 and the dielectric layer 1440. The dielectric layer 1440 and/or the dielectric layer 1450 may be the same dielectric layer as the dielectric layer 1420 and/or the dielectric layer 1430.

Stage 8 illustrates a state after a plurality of cavities 1441 are formed in the dielectric layer 1440 and a plurality of cavities 1451 are formed in the dielectric layer 1450. The plurality of cavities 1441 and the plurality of cavities 1451 may be formed using lithography process. A masking, an exposure and/or a development process may be used to form the plurality of cavities 1441 and the plurality of cavities 1451. The at least one dielectric layer 421 may represent the dielectric layer 1420 and/or the dielectric layer 1440. The at least one dielectric layer 423 may represent the dielectric layer 1430 and/or the dielectric layer 1450.

Stage 9, as shown in FIG. 14C, illustrates a state after interconnects are formed in and over surfaces of the dielectric layer 1440 and the dielectric layer 1450. A plurality of interconnects 1442 may be formed over (e.g., above) a first surface of the dielectric layer 1440 and the plurality of cavities 1441. A plurality of interconnects 1452 may be formed over (e.g., below) a second surface of the dielectric layer 1450 and the plurality of cavities 1451. A masking, a plating and/or an etching process may be used to form the plurality of interconnects 1442 and/or the plurality of interconnects 1452. The plurality of interconnects 1422 and/or the plurality of interconnects 1442 may be represented by a plurality of interconnects 425, as shown at stage 10. The plurality of interconnects 1432 and/or the plurality of interconnects 1452 may be represented by a plurality of interconnects 425, as shown at stage 10. The plurality of core interconnects 422 may be part of the plurality of interconnects 425.

Stage 10 illustrates a state after a solder resist layer 140 and a solder resist layer 142 are formed. A lamination process and/or a deposition process may be used to formed the solder resist layer 140 and the solder resist layer 142.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Sequence for Fabricating a Package Comprising a Substrate

Figure 15A:
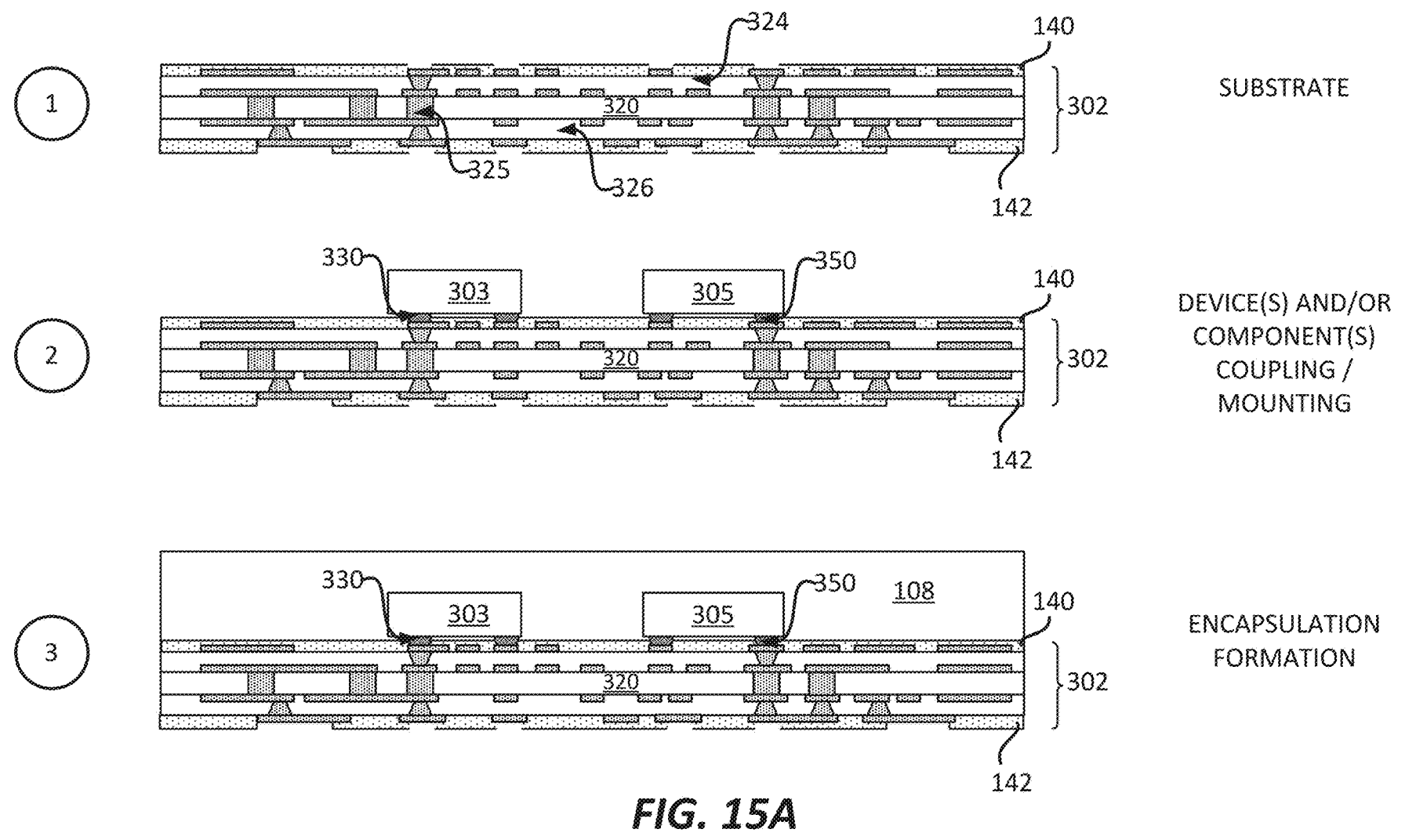
Figure 15B:
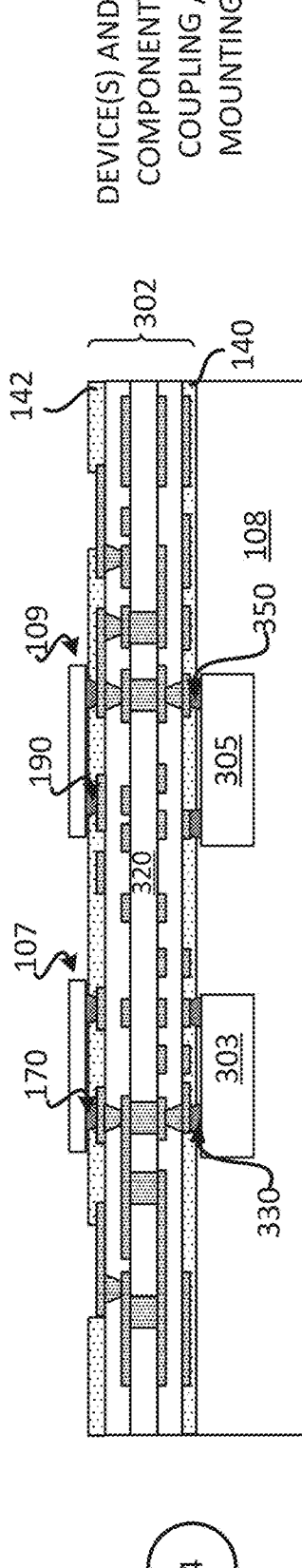
Figure 15B:
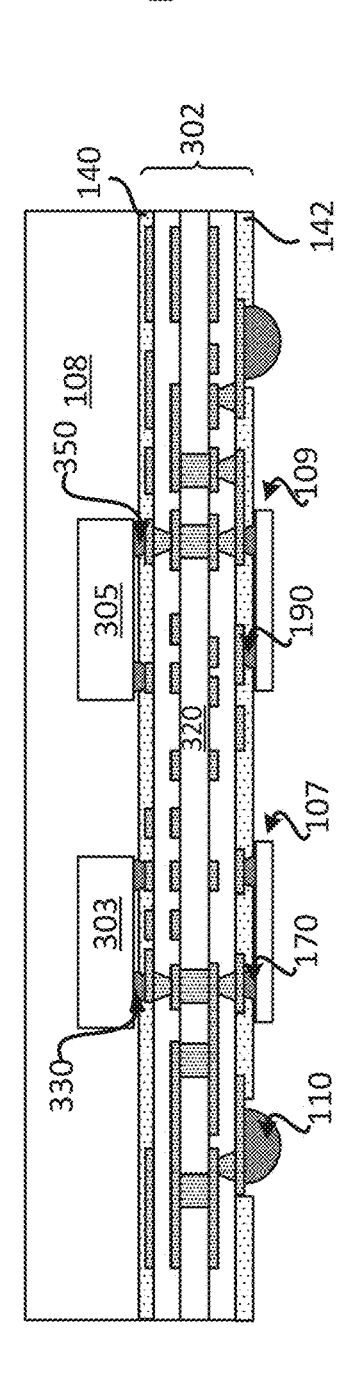

In some implementations, fabricating a package includes several processes. FIGS. 15A-15B illustrates an exemplary sequence for providing or fabricating a package that includes a substrate. In some implementations, the sequence of FIGS. 15A-15B may be used to provide or fabricate the package 300 of FIG. 3. However, the process of FIGS. 15A-15B may be used to fabricate any of the packages described in the disclosure.

It should be noted that the sequence of FIGS. 15A-15B may combine one or more stages in order to simplify and/or clarify the sequence for providing or fabricating a package.

In some implementations, the order of the processes may be changed or modified. In some implementations, one or more of processes may be replaced or substituted without departing from the scope of the disclosure.

Stage 1, as shown in FIG. 15A, illustrates a state after a substrate 302 is provided. The substrate 302 includes a core layer 320, at least one dielectric layer 324, at least one dielectric layer 326, a plurality of interconnects 325, a solder resist layer 140 and a solder resist layer 142. In some implementations, the substrate 302 may be provided. Different implementations may use different substrates with different numbers of metal layers. A substrate may include a coreless substrate, a cored substrate, or an embedded trace substrate (ETS). The substrate 302 may be a package substrate.

Stage 2 illustrates a state after the integrated device 303 is coupled to a first surface (e.g., top surface) of the substrate 302 through a plurality of solder interconnects 330. A solder reflow process may be used to couple the integrated device 303 to the substrate 302. Stage 2 also illustrates a state after the integrated device 305 is coupled to a first surface (e.g., top surface) of the substrate 302 through a plurality of solder interconnects 350. A solder reflow process may be used to couple the integrated device 305 to the substrate 302.

Stage 3 illustrates a state after an encapsulation layer 108 is provided (e.g., formed) over the substrate 302. The encapsulation layer 108 may encapsulate the integrated device 303 and the integrated device 305. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation.

Stage 4, as shown in FIG. 15B, illustrates a state after the passive device 107 is coupled to a second surface (e.g., bottom surface) of the substrate 302 through a plurality of solder interconnects 170. A solder reflow process may be used to couple the passive device 107 to the substrate 302. Stage 4 also illustrates a state after the passive device 109 is coupled to a second surface (e.g., bottom surface) of the substrate 302 through a plurality of solder interconnects 190. A solder reflow process may be used to couple the passive device 109 to the substrate 302.

Stage 5 illustrates a state after a plurality of solder interconnects 110 are coupled to the substrate 302. A solder reflow process may be used to couple the plurality of solder interconnects 110 to the substrate 302.

Figure 16:
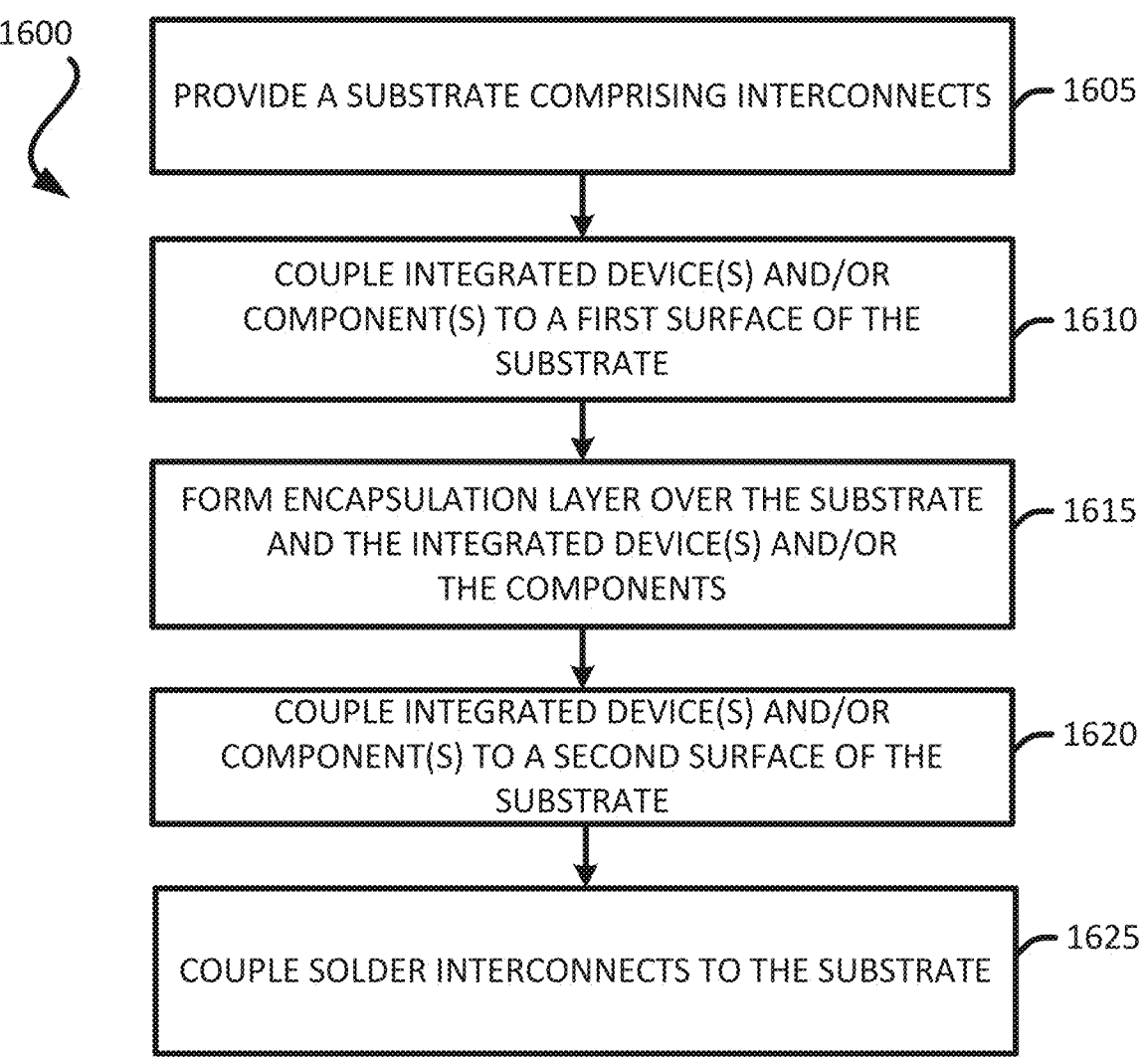
FIG. 16 illustrates an exemplary flow diagram of a method for fabricating a package comprising a package substrate and integrated devices.

Exemplary Flow Diagram of a Method for Fabricating a Package Comprising a Substrate In some implementations, fabricating a package includes several processes. FIG. 16 illustrates an exemplary flow diagram of a method 1600 for providing or fabricating a package comprising a substrate. In some implementations, the method 1600 of FIG. 16 may be used to provide or fabricate the package 300 of FIG. 3 described in the disclosure. However, the method 1600 may be used to provide or fabricate any of the packages (e.g., 100, 200, 400, 500) described in the disclosure.

It should be noted that the method of FIG. 16 may combine one or more processes in order to simplify and/or clarify the method for providing or fabricating a package. In some implementations, the order of the processes may be changed or modified.

The method provides (at 1605) a substrate (e.g., 302, 402). The substrate 302 may be provided by a supplier or fabricated. Different implementations may use different processes to fabricate the substrate 302. Examples of processes that may be used to fabricate a substrate include a semi-additive process (SAP) and a modified semi-additive process (mSAP). The substrate 302 may be a package substrate. The substrate 302 includes a core layer 320, at least one dielectric layer 324, at least one dielectric layer 326, a plurality of interconnects 325, a solder resist layer 140 and a solder resist layer 142. In some implementations, the board substrate 102 may be provided. Different implementations may use different substrates with different numbers of metal layers. A substrate may include a coreless substrate, a cored substrate, or an embedded trace substrate (ETS). In some implementations, the at least one dielectric layer may include prepreg layers. Stage 1 of FIG. 15A, illustrates and describes an example of providing a package substrate.

The method couples (at 1610) an integrated device (e.g., 303) to a first surface of the substrate 302. For example, the integrated device 303 is coupled to a first surface (e.g., top surface) of the substrate 302. The integrated device 303 is coupled to the substrate 302 through the plurality of solder interconnects 130. A solder reflow process may be used to couple the integrated device 103 to the substrate 302. The integrated device 305 is coupled to a first surface (e.g., top surface) of the substrate 302. The integrated device 305 is coupled to the substrate 302 through the plurality of solder interconnects 150. A solder reflow process may be used to couple the integrated device 105 to the substrate 302. Stage 2 of FIG. 15A, illustrates and describes an example of coupling integrated devices to a package substrate.

The method forms (at 1615) an encapsulation layer (e.g., 108) over the substrate (e.g., 302). The encapsulation layer 108 may be provided and formed over and/or around the substrate 302 and the integrated device 303 and the integrated device 305. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation. Stage 3 of FIG. 15A, illustrates and describes an example of forming an encapsulation layer.

The method couples (at 1620) a passive device (e.g., 107) to a second surface of the substrate 302. For example, the passive device 107 is coupled to a second surface (e.g., bottom surface) of the substrate 302. The passive device 107 is coupled to the substrate 302 through the plurality of solder interconnects 170. A solder reflow process may be used to couple the passive device 107 to the substrate 302. The passive device 109 is coupled to a second surface (e.g., bottom surface) of the substrate 302. The passive device 109 is coupled to the substrate 302 through the plurality of solder interconnects 190. A solder reflow process may be used to couple the passive device 109 to the substrate 302. Stage 4 of FIG. 15B, illustrates and describes an example of coupling passive devices to a substrate.

The method couples (at 1625) a plurality of solder interconnects (e.g., 110) to the substrate 302. A solder reflow process may be used to couple the plurality of solder interconnects 110 to the substrate 302. Stage 5 of FIG. 15B, illustrates and describes an example of coupling solder interconnects to a substrate.

The packages (e.g., 300, 400, 500) described in the disclosure may be fabricated one at a time or may be fabricated together as part of one or more wafers and then singulated into individual packages.

Exemplary Board Substrates and Package Substrates

Figure 17:
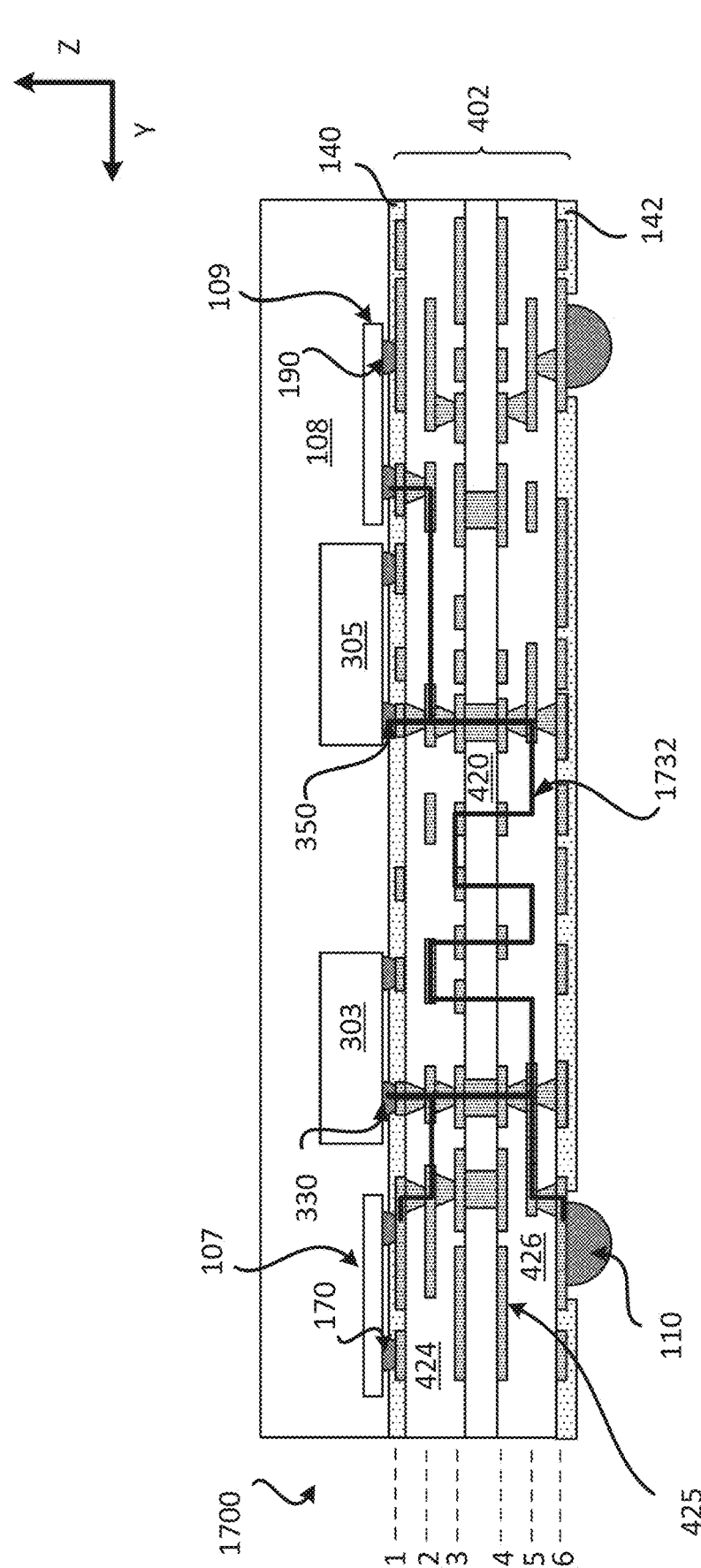
FIG. 17 illustrates a profile cross sectional view of an exemplary package that includes a package substrate and integrated devices.

FIG. 17 illustrates a profile cross sectional view of a package 1700 that includes the substrate 402, the integrated device 303, the integrated device 305, the passive device 107, the passive device 109, and the encapsulation layer 108. The integrated device 303, the integrated device 305 and the encapsulation layer 108 may be coupled to the substrate 402 in a similar manner as the package substrate 302 of FIG. 3. The integrated device 303 is coupled to a first surface (e.g., top surface) of the substrate 402 through a plurality of solder interconnects 330. The integrated device 305 is coupled to the first surface (e.g., top surface) of the substrate 402 through a plurality of solder interconnects 350. The passive device 107 is coupled to the first surface (e.g., top surface) of the substrate 402 through a plurality of solder intercon-nects 170. The passive device 109 is coupled to the first surface (e.g., top surface) of the substrate 402 through a plurality of solder interconnects 190. Thus, the passive device 107 and the passive device 109 are located on the same surface of the substrate 402 as the integrated device 303 and the integrated device 305. The passive device 107 and the passive device 109 may be considered as die side passive devices.

The integrated device 303, the integrated device 305, the passive device 107 and the passive device 109 may be configured to be electrically coupled together through an electrical path 1732. The electrical path 1732 may include a plurality of interconnects (e.g., first plurality of intercon-nects, second plurality of interconnects, third plurality of interconnects) from the plurality of interconnects 425.

The electrical path 1732 may include a plurality of interconnects from the plurality of interconnects 425 that are configured as at least one inductor defined by at least one interconnect on one metal layer, another interconnect on another metal layer and at least one via interconnect. The inductor is integrated in the package substrate 402 and is configured to be coupled to power. The inductor may include one or more multiple windings (from interconnects) up and down two or more metal layers of the package substrate 402. The inductor that is defined by at least one via interconnect (e.g., additional via interconnect) may be located along an electrical path that is located between the passive device 107 and the passive device 109. The inductor that is defined by at least one via interconnect (e.g., additional via intercon-nect) may be located along an electrical path that is located between the integrated device 303 and the integrated device 305. The inductor is located along a common path (e.g., common electrical path) located between the integrated device 303 and the integrated device 305, and located between the passive device 107 and the passive device 109. Thus, the additional windings (e.g., vertical windings and/or horizontal windings) of interconnects that are part of an electrical path between the passive device 107 and the passive device 109 and are part of an electrical path between the integrated device 303 and the integrated device 305, help increase the inductance, which helps reduce noise transfer between integrated devices. An example of a common path is illustrated and described in detail in at least FIG. 5.

Figure 18:
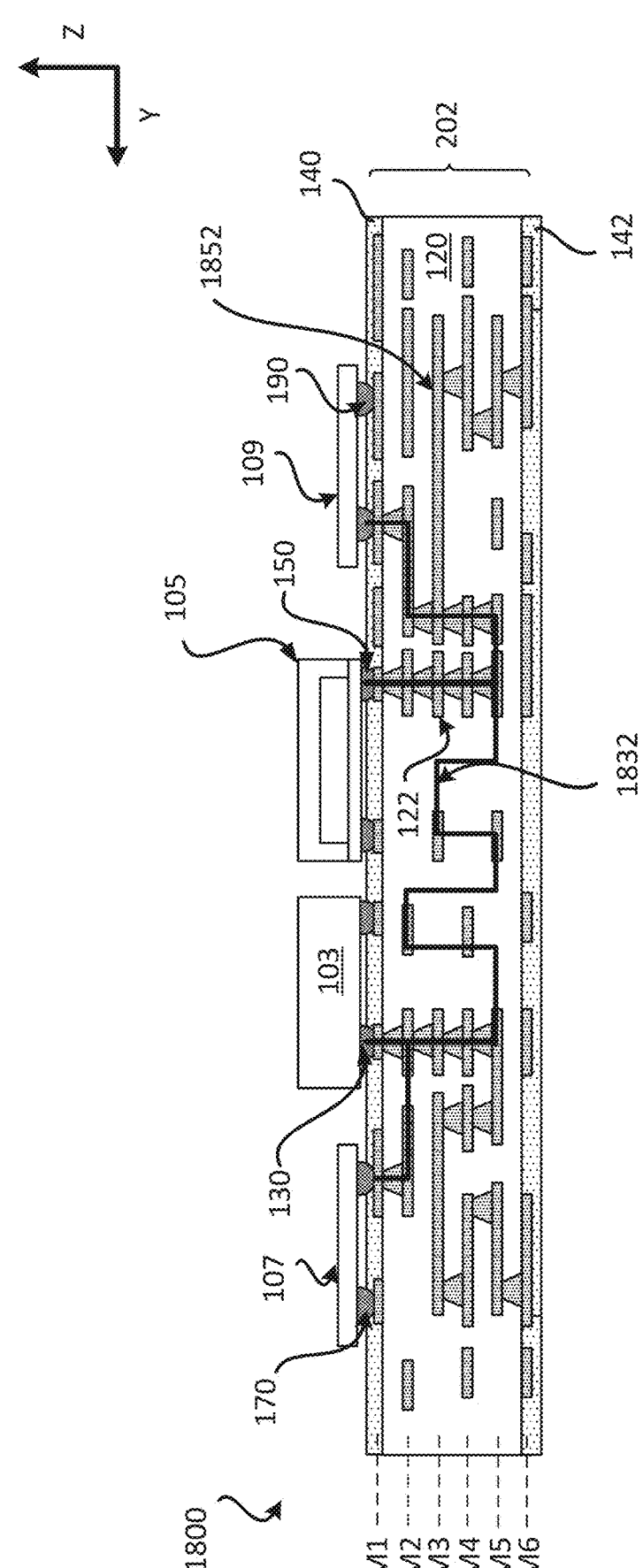
FIG. 18 illustrates a profile cross sectional view of integrated devices coupled to a board substrate.

FIG. 18 illustrates a profile cross sectional view of a configuration 1800 that includes the board substrate 202, the integrated device 103, the integrated device 105, the passive device 107 and the passive device 109. The integrated device 103 and the integrated device 105 may be coupled to the board substrate 202 in a similar manner as the board substrate 102 of FIG. 1.

The integrated device 103 is coupled to a first surface (e.g., top surface) of the board substrate 202 through a plurality of solder interconnects 130. The integrated device 105 is coupled to the first surface (e.g., top surface) of the board substrate 202 through a plurality of solder intercon-nects 150. The passive device 107 is coupled to the first surface (e.g., top surface) of the board substrate 202 through a plurality of solder interconnects 170. The passive device 109 is coupled to the first surface (e.g., top surface) of the board substrate 202 through a plurality of solder intercon-nects 190. Thus, the passive device 107 and the passive device 109 are located on the same surface of the board substrate 202 as the integrated device 103 and the integrated device 105. The passive device 107 and the passive device 109 may be considered as die side passive devices.

The integrated device 103, the integrated device 105, the passive device 107 and the passive device 109 may be configured to be electrically coupled together through an electrical path 1832. The electrical path 1832 may include a plurality of interconnects (e.g., first plurality of intercon-nects, second plurality of interconnects, third plurality of interconnects) from the plurality of interconnects 122.

The electrical path 1832 may include a plurality of interconnects from the plurality of interconnects 122 that are configured as at least one inductor defined by at least one interconnect on one metal layer, another interconnect on another metal layer and at least one via interconnect. The inductor is integrated in the board substrate 202 and is configured to be coupled to power. The inductor may include one or more multiple windings (from interconnects) up and down two or more metal layers of the board substrate 202. The inductor that is defined by at least one via interconnect (e.g., additional via interconnect) may be located along an electrical path that is located between the passive device 107 and the passive device 109. The inductor that is defined by at least one via interconnect (e.g., additional via intercon-nect) may be located along an electrical path that is located between the integrated device 103 and the integrated device 105. The inductor is located along a common path (e.g., common electrical path) located between the integrated device 103 and the integrated device 105, and located between the passive device 107 and the passive device 109. Thus, the additional windings (e.g., vertical windings and/or horizontal windings) of interconnects that are part of an electrical path between the passive device 107 and the passive device 109 and are part of an electrical path between the integrated device 103 and the integrated device 105, help increase the inductance, which helps reduce noise transfer between integrated devices. An example of a common path is illustrated and described in detail in at least FIG. 5.

Figure 19:
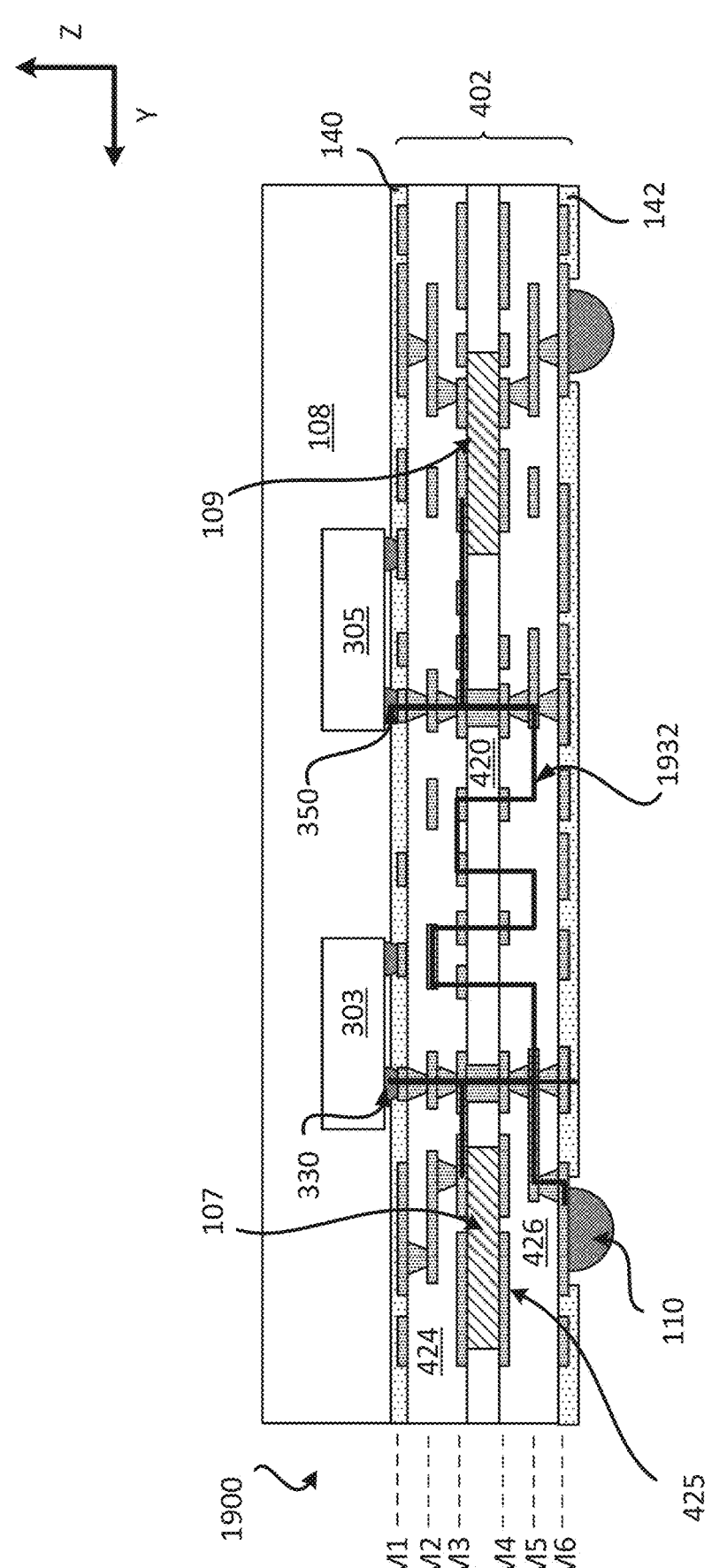
FIG. 19 illustrates a profile cross sectional view of an exemplary package that includes a package substrate and integrated devices.

FIG. 19 illustrates a profile cross sectional view of a package 1900 that includes the substrate 402, the integrated device 303, the integrated device 305, the passive device 107, the passive device 109, and the encapsulation layer 108. The integrated device 303, the integrated device 305 and the encapsulation layer 108 may be coupled to the substrate 402 in a similar manner as the package substrate 302 of FIG. 3. The integrated device 303 is coupled to a first surface (e.g., top surface) of the substrate 402 through a plurality of solder interconnects 330. The integrated device 305 is coupled to the first surface (e.g., top surface) of the substrate 402 through a plurality of solder interconnects 350. The passive device 107 is coupled to the substrate 402 such that the passive device 107 is located in the substrate 402. The passive device 109 is coupled to the substrate 402 such that the passive device 109 is located in the substrate 402. The passive device 107 and the passive device 109 may be considered as embedded passive devices.

The integrated device 303, the integrated device 305, the passive device 107 and the passive device 109 may be configured to be electrically coupled together through an electrical path 1932. The electrical path 1932 may include a plurality of interconnects (e.g., first plurality of interconnects, second plurality of interconnects, third plurality of interconnects) from the plurality of interconnects 425.

The electrical path 1932 may include a plurality of interconnects from the plurality of interconnects 425 that are configured as at least one inductor defined by at least one interconnect on one metal layer, another interconnect on another metal layer and at least one via interconnect. The inductor is integrated in the package substrate 402 and is configured to be coupled to power. The inductor may include one or more multiple windings (from interconnects) up and down two or more metal layers of the package substrate 402. The inductor that is defined by at least one via interconnect (e.g., additional via interconnect) may be located along an electrical path that is located between the passive device 107 and the passive device 109. The inductor that is defined by at least one via interconnect (e.g., additional via interconnect) may be located along an electrical path that is located between the integrated device 303 and the integrated device 305. The inductor is located along a common path (e.g., common electrical path) located between the integrated device 303 and the integrated device 305, and located between the passive device 107 and the passive device 109. Thus, the additional windings (e.g., vertical windings and/or horizontal windings) of interconnects that are part of an electrical path between the passive device 107 and the passive device 109 and are part of an electrical path between the integrated device 303 and the integrated device 305, help increase the inductance, which helps reduce noise transfer between integrated devices. An example of a common path is illustrated and described in detail in at least FIG. 5.

Exemplary Electronic Devices

Figure 20:
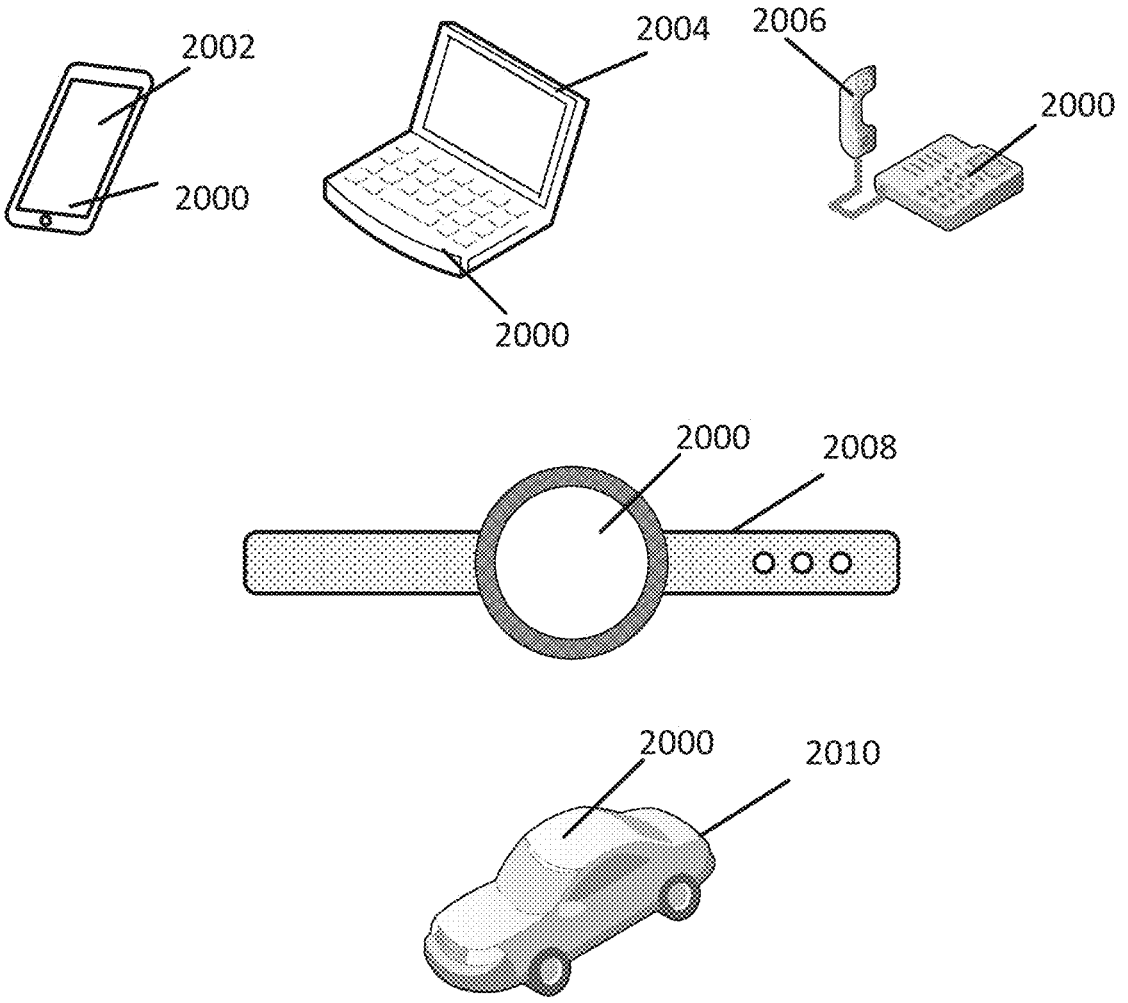
FIG. 20 illustrates various electronic devices that may integrate a die, an electronic circuit, an integrated device, an integrated passive device (IPD), a passive component, a package, and/or a device package described herein.

FIG. 20 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 2002, a laptop computer device 2004, a fixed location terminal device 2006, a wearable device 2008, or automotive vehicle 2010 may include a device 2000 as described herein. The device 2000 may be, for example, any of the devices and/or integrated circuit (IC) packages described herein. The devices 2002, 2004, 2006 and 2008 and the vehicle 2010 illustrated in FIG. 20 are merely exemplary. Other electronic devices may also feature the device 2000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-12, 13A-13C, 14A-14C, 15A-15B and/or 16-20 may be rearranged and/or combined into a single component, process, feature or function or embodied in several components, processes, or functions. Additional elements, components, processes, and/or functions may also be added without departing from the disclosure. It should also be noted FIGS. 1-12, 13A-13C, 14A-14C, 15A-15B and/or 16-20 and its corresponding description in the present disclosure is not limited to dies and/or ICs. In some implementations, FIGS. 1-12, 13A-13C, 14A-14C, 15A-15B and/or 16-20 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/ or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/ or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A device comprising a substrate comprising at least one dielectric layer; and a plurality of interconnects that are formed on at least a plurality of metal layers of the substrate, wherein the plurality of metal layers include a first metal layer and a second metal layer, wherein the plurality of interconnects include a power interconnect, wherein the power interconnect is configured to be electrically coupled to power. The device includes a first integrated device coupled to a first surface of the substrate; a second integrated device coupled to the first surface of the substrate; a first passive device coupled to the substrate; and a second passive device coupled to the substrate. The first integrated device, the first passive device, the second integrated device and the second passive device are configured to be electrically coupled to the power interconnect through a first plurality of interconnects from the plurality of interconnects. At least one interconnect from the first plurality of interconnects is configured to operate as an inductor configured to be electrically coupled to power, wherein the first plurality of interconnects include a first interconnect on the first metal layer, a second interconnect on the second metal layer, and a via interconnect coupled to the first interconnect and the second interconnect.

Aspect 2: The device of aspect 1, wherein the substrate includes a board substrate or a package substrate.

Aspect 3: The device of aspects 1 through 2, wherein the first passive device is coupled to the first surface of the substrate, and wherein the second passive device is coupled to the first surface of the substrate.

Aspect 4: The device of aspect 1 through 2, wherein the first passive device is coupled to a second surface of the substrate, and wherein the second passive device is coupled to the second surface of the substrate.

Aspect 5: The device of aspects 1 through 2, wherein the first passive device is located in the substrate, and wherein the second passive device is located in the substrate.

Aspect 6: The device of aspects 1 through 5, wherein the inductor is located along a common electrical path between the first integrated device, the second integrated device, the first passive device and the second passive device.

Aspect 7: The device of aspects 1 through 6, wherein the first integrated device and the second integrated device are configured to share a common power supply.

Aspect 8: The device of aspects 7, further comprising a power management integrated circuit (PMIC) configured to provide the common power supply for the first integrated device and the second integrated device.

Aspect 9: The device of aspects 1 through 8, wherein the first passive device includes a first capacitor, and wherein the second passive device includes a second capacitor.

Aspect 10: The device of aspects 1 through 9, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 11: A device comprising a board substrate, a first integrated device coupled to a first surface of the board substrate, a second integrated device coupled to the first surface of the board substrate, a first passive device coupled to a second surface of the board substrate, and a second passive device coupled to the second surface of the board substrate. The board substrate comprises at least one dielectric layer; and a plurality of interconnects that are formed on at least a plurality of metal layers of the board substrate. The plurality of metal layers include a first metal layer and a second metal layer. The plurality of interconnects include a power interconnect. The power interconnect is configured to be electrically coupled to power. The first integrated device, the first passive device, the second integrated device and the second passive device are configured to be electrically coupled to the power interconnect through a first plurality of interconnects from the plurality of interconnects. The first plurality of interconnects are configured to operate as an inductor configured to be electrically coupled to power, wherein the first plurality of interconnects include a first interconnect on the first metal layer, a second interconnect on the second metal layer, and a via interconnect coupled to the first interconnect and the second interconnect.

Aspect 12: The device of aspect 11, wherein the first plurality of interconnects include a common electrical path between the first integrated device, the second integrated device, the first passive device and the second passive device, wherein the first plurality of interconnects include several interconnects on the first metal layer, several interconnects on the second metal layer and several via interconnects between the first metal layer and the second metal layer, and wherein the first plurality of interconnects may define several windings of the inductor.

Aspect 13: The device of aspects 11 through 12, wherein the first integrated device and the second integrated device share the power that is configured to be provided through the power interconnect.

Aspect 14: The device of aspects 11 through 13, wherein the first metal layer is different from the second metal layer, and wherein the first metal layer may be any metal layer of the board substrate.

Aspect 15: The device of aspects 11 through 13, wherein the first metal layer is different from the second metal layer, and wherein the second metal layer may be any metal layer of the board substrate.

Aspect 16: The device of aspects 11 through 15, further comprising a power management integrated circuit coupled to the board substrate, wherein the power management integrated circuit is configured to be coupled to the inductor through the power interconnect.

Aspect 17: The device of aspects 11 through 16, further comprising a ferrite bead device coupled to the board substrate.

Aspect 18: The device of aspects 11 through 17, wherein the plurality of metal layers further include a third metal layer and a fourth metal layer, wherein the first plurality of interconnects includes several interconnects on the first metal layer, several interconnects on the second metal layer, several via interconnects between the first metal layer and the second metal layer, several interconnects on the third metal layer, several via interconnects between the second metal layer and the third metal layer, several interconnects on the fourth metal layer, and several interconnects between the third metal layer and the fourth metal layer, and wherein the first plurality of interconnects may define several windings of the inductor.

Aspect 19: The device of aspects 11 through 18, wherein the plurality of interconnects include a plurality of trace interconnects configured to provide at least one electrical path for input/output signals, and wherein the power interconnect includes a width that is greater than a width for the plurality of trace interconnects configured to provide input/output signals.

Aspect 20: The device of aspect 19, wherein the width of the power interconnect is at least 50 percent greater than the width of the plurality of trace interconnects.

Aspect 21: A device comprising a package substrate, a first integrated device coupled to a first surface of the package substrate, a second integrated device coupled to the first surface of the package substrate, a first passive device coupled to a second surface of the package substrate, and a second passive device coupled to the second surface of the package substrate. The package substrate comprises at least one dielectric layer; and a plurality of interconnects that are formed on at least a plurality of metal layers of the package substrate. The plurality of metal layers include a first metal layer and a second metal layer. The plurality of interconnects include a power interconnect. The power interconnect is configured to be electrically coupled to power. The first integrated device, the first passive device, the second integrated device and the second passive device are configured to be electrically coupled to the power interconnect through a first plurality of interconnects from the plurality of interconnects. The first plurality of interconnects are configured to operate as an inductor configured to be electrically coupled to power, wherein the first plurality of interconnects include a first interconnect on the first metal layer, a second interconnect on the second metal layer, and a via interconnect coupled to the first interconnect and the second interconnect.

Aspect 22: The device of aspect 21, wherein the first plurality of interconnects include a common electrical path between the first integrated device, the second integrated device, the first passive device and the second passive device, wherein the first plurality of interconnects include several interconnects on the first metal layer, several interconnects on the second metal layer and several via interconnects between the first metal layer and the second metal layer, and wherein the first plurality of interconnects may define several windings of the inductor.

Aspect 23: The device of aspects 21 through 22, wherein the first integrated device and the second integrated device share the power that is configured to be provided through the power interconnect.

Aspect 24: The device of aspects 21 through 23, wherein the first metal layer is different from the second metal layer, and wherein the first metal layer may be any metal layer of the package substrate.

Aspect 25: The device of aspects 21 through 23, wherein the first metal layer is different from the second metal layer, and wherein the second metal layer may be any metal layer of the package substrate.

Aspect 26: The device of aspects 21 through 25, further comprising a power management integrated circuit coupled to the package substrate, wherein the power management integrated circuit is configured to be coupled to the inductor through the power interconnect.

Aspect 27: The device of aspects 21 through 26, further comprising a ferrite bead device coupled to the package substrate.

Aspect 28: The device of aspects 21 through 27, wherein the plurality of metal layers further include a third metal layer and a fourth metal layer, wherein the first plurality of interconnects includes several interconnects on the first metal layer, several interconnects on the second metal layer, several via interconnects between the first metal layer and the second metal layer, several interconnects on the third metal layer, several via interconnects between the second metal layer and the third metal layer, several interconnects on the fourth metal layer, and several interconnects between the third metal layer and the fourth metal layer, and wherein the first plurality of interconnects may define several windings of the inductor.

Aspect 29: The device of aspects 21 through 28, wherein the plurality of interconnects include a plurality of trace interconnects configured to provide at least one electrical path for input/output signals, and wherein the power interconnect includes a width that is greater than a width for the plurality of trace interconnects configured to provide input/output signals.

Aspect 30: The device of aspect 29, wherein the width of the power interconnect is at least 50 percent greater than the width of the plurality of trace interconnects.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:
a substrate comprising:
    at least one dielectric layer; and
    a plurality of interconnects that are formed on at least a plurality of metal layers of the substrate,
        wherein the plurality of metal layers include a first metal layer and a second metal layer,
        wherein the plurality of interconnects include a first plurality of interconnects, a second plurality of interconnects and a power interconnect,
        wherein the second plurality of interconnects include pad interconnects that are configured to provide electrical paths for input/output signals,
        wherein the first plurality of interconnects and the power interconnect are configured to be electrically coupled to power, and
        wherein the power interconnect includes an interconnect that has a width that is greater than any width of all interconnects from the second plurality of interconnects;
a first integrated device coupled to a first surface of the substrate;
a second integrated device coupled to the first surface of the substrate;
a first passive device coupled to the substrate; and
a second passive device coupled to the substrate,
    wherein the first integrated device, the first passive device, the second integrated device and the second passive device are configured to be electrically coupled to the power interconnect through the first plurality of interconnects from the plurality of interconnects, and
    wherein at least one interconnect from the first plurality of interconnects is configured to operate as an inductor configured to be electrically coupled to power, wherein the first plurality of interconnects include a first interconnect on the first metal layer, a second interconnect on the second metal layer, and a via interconnect coupled to the first interconnect and the second interconnect.

2. The device of claim 1, wherein the substrate includes a board substrate or a package substrate.

3. The device of claim 1,
wherein the first passive device is coupled to the first surface of the substrate, and
wherein the second passive device is coupled to the first surface of the substrate.

4. The device of claim 1,
wherein the first passive device is coupled to a second surface of the substrate, and
wherein the second passive device is coupled to the second surface of the substrate.

5. The device of claim 1,
wherein the first passive device is located in the substrate, and
wherein the second passive device is located in the substrate.

6. The device of claim 1, wherein the inductor is located along a common electrical path between the first integrated device, the second integrated device, the first passive device and the second passive device.

7. The device of claim 1, wherein the first integrated device and the second integrated device are configured to share a common power supply.

8. The device of claim 7, further comprising a power management integrated circuit (PMIC) configured to provide the common power supply for the first integrated device and the second integrated device.

9. The device of claim 1,
wherein the first passive device includes a first capacitor, and
wherein the second passive device includes a second capacitor.

10. The device of claim 1, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. A device comprising:
a board substrate comprising:
    at least one dielectric layer; and
    a plurality of interconnects that are formed on at least a plurality of metal layers of the board substrate,
        wherein the plurality of metal layers include a first metal layer and a second metal layer,
        wherein the plurality of interconnects include a first plurality of interconnects, a second plurality of interconnects and a power interconnect,
        wherein the second plurality of interconnects include pad interconnects that are configured to provide electrical paths for input/output signals,
        wherein the first plurality of interconnects and the power interconnect are configured to be electrically coupled to power, and
        wherein the power interconnect includes an interconnect that has a width that is greater than any width of all interconnects from the second plurality of interconnects;
a first integrated device coupled to a first surface of the board substrate;
a second integrated device coupled to the first surface of the board substrate;
a first passive device coupled to a second surface of the board substrate; and
a second passive device coupled to the second surface of the board substrate,
    wherein the first integrated device, the first passive device, the second integrated device and the second passive device are configured to be electrically coupled to the power interconnect through the first plurality of interconnects from the plurality of interconnects, and
    wherein the first plurality of interconnects are configured to operate as an inductor configured to be electrically coupled to power, wherein the first plurality of interconnects include a first interconnect on the first metal layer, a second interconnect on the second metal layer, and a via interconnect coupled to the first interconnect and the second interconnect.

12. The device of claim 11,
wherein the first plurality of interconnects include a common electrical path between the first integrated device, the second integrated device, the first passive device and the second passive device, wherein the first plurality of interconnects include several interconnects on the first metal layer, several interconnects on the second metal layer and several via interconnects between the first metal layer and the second metal layer, and wherein the first plurality of interconnects define several windings of the inductor.

13. The device of claim 11, wherein the first integrated device and the second integrated device share the power that is configured to be provided through the power interconnect.

14. The device of claim 11, wherein the first metal layer is different from the second metal layer, and wherein the first metal layer may be any metal layer of the board substrate.

15. The device of claim 11, wherein the first metal layer is different from the second metal layer, and wherein the second metal layer may be any metal layer of the board substrate.

16. The device of claim 11, further comprising a power management integrated circuit coupled to the board substrate, wherein the power management integrated circuit is configured to be coupled to the inductor through the power interconnect.

17. The device of claim 11, further comprising a ferrite bead device coupled to the board substrate.

18. The device of claim 11, wherein the plurality of metal layers further include a third metal layer and a fourth metal layer, wherein the first plurality of interconnects include several interconnects on the first metal layer, several interconnects on the second metal layer, several via interconnects between the first metal layer and the second metal layer, several interconnects on the third metal layer, several via interconnects between the second metal layer and the third metal layer, several interconnects on the fourth metal layer, and several interconnects between the third metal layer and the fourth metal layer, and wherein the first plurality of interconnects define several windings of the inductor.

19. The device of claim 11, wherein the second plurality of interconnects further include a plurality of trace interconnects configured to provide at least one electrical path for input/output signals, and wherein the power interconnect includes a width that is greater than any width of all trace interconnects for the plurality of trace interconnects configured to provide input/output signals.

20. The device of claim 19, wherein the width of the power interconnect is at least 50 percent greater than the width of any trace interconnect of the plurality of trace interconnects.

21. A device comprising:

a package substrate comprising:

at least one dielectric layer; and a plurality of interconnects that are formed on at least a plurality of metal layers of the package substrate, wherein the plurality of metal layers include a first metal layer and a second metal layer, wherein the plurality of interconnects include a first plurality of interconnects, a second plurality of interconnects and a power interconnect, and wherein the second plurality of interconnects include pad interconnects that are configured to provide electrical paths for input/output signals, wherein the first plurality of interconnects and the power interconnect are configured to be electrically coupled to power, and wherein the power interconnect includes an interconnect that has a width that is greater than any width of all interconnects from the second plurality of interconnects;

a first integrated device coupled to a first surface of the package substrate;

a second integrated device coupled to the first surface of the package substrate;

a first passive device coupled to a second surface of the package substrate; and a second passive device coupled to the second surface of the package substrate, wherein the first integrated device, the first passive device, the second integrated device and the second passive device are configured to be electrically coupled to the power interconnect through a first plurality of interconnects from the plurality of interconnects, and wherein the first plurality of interconnects are configured to operate as an inductor configured to be electrically coupled to power, wherein the first plurality of interconnects include a first interconnect on the first metal layer, a second interconnect on the second metal layer, and a via interconnect coupled to the first interconnect and the second interconnect.

22. The device of claim 21, wherein the first plurality of interconnects include a common electrical path between the first integrated device, the second integrated device, the first passive device and the second passive device, wherein the first plurality of interconnects include several interconnects on the first metal layer, several interconnects on the second metal layer and several via interconnects between the first metal layer and the second metal layer, and wherein the first plurality of interconnects define several windings of the inductor.

23. The device of claim 21, wherein the first integrated device and the second integrated device share the power that is configured to be provided through the power interconnect.

24. The device of claim 21, wherein the first metal layer is different from the second metal layer, and wherein the first metal layer may be any metal layer of the package substrate.

25. The device of claim 21, wherein the first metal layer is different from the second metal layer, and wherein the second metal layer may be any metal layer of the package substrate.

26. The device of claim 21, further comprising a power management integrated circuit coupled to the package substrate, wherein the power management integrated circuit is configured to be coupled to the inductor through the power interconnect.

27. The device of claim 21, further comprising a ferrite bead device coupled to the package substrate.

28. The device of claim 21, wherein the plurality of metal layers further include a third metal layer and a fourth metal layer, wherein the first plurality of interconnects include several interconnects on the first metal layer, several interconnects on the second metal layer, several via interconnects between the first metal layer and the second metal layer, several interconnects on the third metal layer, several via interconnects between the second metal layer and the third metal layer, several interconnects on the fourth metal layer, and several interconnects between the third metal layer and the fourth metal layer, and wherein the first plurality of interconnects define several windings of the inductor.

29. The device of claim 21, wherein the second plurality of interconnects further include a plurality of trace interconnects configured to provide at least one electrical path for input/output signals, and wherein the power interconnect includes a width that is greater than any width of all trace interconnects for the plurality of trace interconnects configured to provide input/output signals.

30. The device of claim 29, wherein the width of the power interconnect is at least 50 percent greater than the width of any trace interconnect of the plurality of trace interconnects.

* * * * *